(12) United States Patent
Bai et al.

(10) Patent No.: US 9,704,745 B2
(45) Date of Patent: Jul. 11, 2017

(54) METHODS OF FORMING SEMICONDUCTOR DEVICE

(71) Applicant: Samsung Electronics Co., Ltd., Suwon-si, Gyeonggi-do (KR)

(72) Inventors: KeunHee Bai, Suwon-si (KR); Dohyoung Kim, Hwaseong-si (KR); Johnsoo Kim, Hwaseong-si (KR); Heungsik Park, Yongin-si (KR); Doo-Young Lee, Seoul (KR); Sanghyun Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/955,374

(22) Filed: Dec. 1, 2015

(65) Prior Publication Data
US 2016/0204030 A1    Jul. 14, 2016

(30) Foreign Application Priority Data

Jan. 8, 2015  (KR) .................. 10-2015-0002882

(51) Int. Cl.
| | | |
|---|---|---|
| H01L 21/02 | (2006.01) | |
| H01L 21/768 | (2006.01) | |
| H01L 29/51 | (2006.01) | |
| H01L 21/8234 | (2006.01) | |
| H01L 29/66 | (2006.01) | |

(52) U.S. Cl.
CPC .............. *H01L 21/76897* (2013.01); *H01L 21/823431* (2013.01); *H01L 21/823475* (2013.01); *H01L 29/517* (2013.01); *H01L 29/66545* (2013.01)

(58) Field of Classification Search
None
See application file for complete search history.

(56) References Cited

U.S. PATENT DOCUMENTS

| | | | | |
|---|---|---|---|---|
| 7,632,736 | B2* | 12/2009 | Wei | ............... H01L 21/76897 |
| | | | | 257/E21.545 |
| 7,786,017 | B1 | 8/2010 | Morgenfeld et al. | |
| 7,947,610 | B2* | 5/2011 | Tsunashima | ...... H01L 21/28088 |
| | | | | 257/E21.24 |
| 9,240,326 | B2* | 1/2016 | Cheng | ............... H01L 21/283 |
| 9,412,656 | B2* | 8/2016 | Fu | .................. H01L 21/76879 |
| 2006/0148227 | A1* | 7/2006 | Kronke | ........... H01L 21/76802 |
| | | | | 438/586 |
| 2008/0153279 | A1 | 6/2008 | Hwang | |

(Continued)

FOREIGN PATENT DOCUMENTS

| | | | |
|---|---|---|---|
| KR | 100330713 B1 | 4/2002 | |
| KR | 20050041551 A | 5/2005 | |

(Continued)

*Primary Examiner* — John C Ingham
(74) *Attorney, Agent, or Firm* — Harness, Dickey & Pierce P.L.C.

(57) ABSTRACT

A sacrificial layer is formed to cover the gate structures. The sacrificial layer is patterned to form a first opening in the sacrificial layer. A preliminary contact is formed in the first opening and the sacrificial layer is selectively removed. An insulating layer is formed to cover the gate structures and to expose the preliminary contact. The preliminary contact is removed to form a second opening in the insulating layer, and then a contact is formed in the second opening.

19 Claims, 35 Drawing Sheets

(56) References Cited

U.S. PATENT DOCUMENTS

2013/0330923 A1    12/2013   Lin et al.
2014/0206167 A1     7/2014   Wu et al.

FOREIGN PATENT DOCUMENTS

| KR | 1020080010996 A | 1/2008 |
|----|-----------------|--------|
| KR | 101183640 B1 | 4/2008 |
| KR | 20080092614 A | 10/2008 |

\* cited by examiner

METHODS OF FORMING SEMICONDUCTOR DEVICE

CROSS-REFERENCE TO RELATED APPLICATION

This U.S. non-provisional patent application claims priority under 35 U.S.C §119 to Korean Patent Application No. 10-2015-0002882, filed on Jan. 8, 2015, in the Korean Intellectual Property Office, the disclosure of which is hereby incorporated by reference in its entirety.

BACKGROUND

The inventive concepts relate to methods of forming a semiconductor device. More particularly, the inventive concepts relate to methods of forming a contact of a semiconductor device.

Semiconductor devices are widely used in an electronic industry because of their small sizes, multi-functional characteristics, and/or low manufacture costs. Semiconductor devices may be categorized as any one of semiconductor memory devices storing logical data, semiconductor logic devices processing logical data, and hybrid semiconductor devices having both the function of the semiconductor memory devices and the function of the semiconductor logic devices. As the electronic industry has been highly developed, semiconductor devices with excellent characteristics have been demanded. For example, high-reliable, high-speed and/or multi-functional semiconductor devices have been increasingly demanded. However, to satisfy these demands, structures of semiconductor devices have become more and more complicated and semiconductor devices have been highly integrated.

SUMMARY

Some embodiments of the inventive concepts may provide methods of forming a semiconductor device including a contact with improved reliability.

In one aspect, a method of forming a semiconductor device may include: forming gate structures on a substrate; and forming a contact between the gate structures. Each of the gate structures may include: a gate insulating layer on the substrate; a gate electrode on the gate insulating layer; and a capping pattern covering a top surface and sidewalls of the gate electrode. Forming the contact may include: forming a sacrificial layer covering the gate structures; patterning the sacrificial layer to form a first opening in the sacrificial layer, the first opening exposing the substrate between the gate structures; forming a preliminary contact in the first opening; selectively removing the sacrificial layer; forming an insulating layer that covers the gate structures and exposes the preliminary contact; removing the preliminary contact to form a second opening in the insulating layer, the second opening exposing the substrate; and forming the contact in the second opening.

In an embodiment, a ratio of an etch rate of the sacrificial layer to an etch rate of the capping pattern may be greater than a ratio of an etch rate of the insulating layer to the etch rate of the capping pattern.

In an embodiment, the first opening may be formed by a dry etching process using a gas containing oxygen, nitrogen, and hydrogen.

In an embodiment, the sacrificial layer may include a carbon-containing material or a photoresist. The sacrificial layer may include a spin-on-hardmask (SOH) layer or a SiCOH layer.

In an embodiment, the sacrificial layer may be removed using an oxidation treatment, an ozone treatment, an ultraviolet (UV) treatment, or a wet cleaning process.

In an embodiment, the insulating layer may include a silicon oxide layer.

In an embodiment, the capping pattern may include at least one of a silicon nitride layer or a silicon oxynitride layer.

In an embodiment, the preliminary contact may include a material having an etch selectivity with respect to the sacrificial layer, the insulating layer, and the capping pattern. The preliminary contact may include poly-silicon or titanium nitride. The preliminary contact may be deposited at a temperature of 400° C. or less.

In an embodiment, the capping pattern may include: sidewall capping patterns on the sidewalls of the gate electrode; and an upper capping pattern on the top surface of the gate electrode. The gate insulating layer may extend between the gate electrode and the sidewall capping pattern. The gate electrode may include: a metal layer including tungsten; and a metal nitride layer between the metal layer and the gate insulating layer. The gate insulating layer may include a metal oxide layer.

In another aspect, a method of forming a semiconductor device may include: forming an isolation pattern in a substrate to define active fins, the active fins protruding from the isolation pattern, the active fins extending in a first direction, and the active tins spaced apart from each other in a second direction intersecting the first direction; forming gate structures intersecting the active fins and extending in the second direction, each of the gate structures comprising: a gate insulating layer on the substrate; a gate electrode on the gate insulating layer; and a capping pattern covering a top surface and sidewalls of the gate electrode; forming a preliminary contact in contact with the active fins and the isolation pattern between the gate structures; forming an insulating layer that covers the gate structures and exposes the preliminary contact; removing the preliminary contact to form a contact hole in the insulating layer, the contact hole exposing the active fins and the isolation pattern; and forming a contact in the contact hole, the contact connected to the active fins, and the contact being in contact with the isolation pattern.

In an embodiment, forming the preliminary contact may include: forming a sacrificial layer covering the gate structures; patterning the sacrificial layer to form a preliminary contact hole in the sacrificial layer, the preliminary contact hole exposing the active fins and the isolation pattern which are disposed between the gate structures; and forming the preliminary contact in the preliminary contact hole.

In an embodiment, the sacrificial layer may include a carbon-containing material or a photoresist.

In an embodiment, the capping pattern may include at least one of a silicon nitride layer or a silicon oxynitride layer.

In an embodiment, the preliminary contact may include poly-silicon or titanium nitride.

BRIEF DESCRIPTION OF THE DRAWINGS

The inventive concepts will become more apparent in view of the attached drawings and accompanying detailed description.

FIGS. 9A to 16A are cross-sectional views corresponding to the lines I-I' and II-40 of FIG. 7 to illustrate a method of forming a semiconductor device according to some example embodiments of the inventive concepts;

FIGS. 9B to 16B are cross-sectional views corresponding to the lines III-III' and IV-IV' of FIG. 7 to illustrate a method of forming a semiconductor device according to some example embodiments of the inventive concepts;

DETAILED DESCRIPTION OF EXAMPLE EMBODIMENTS

Figure 1:
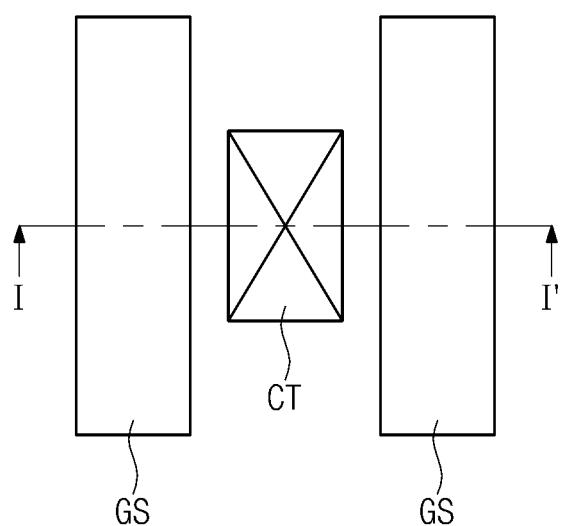
FIG. 1 is a plan view illustrating a semiconductor device according to an example embodiment of the inventive concepts.

The inventive concepts will now be described more fully hereinafter with reference to the accompanying drawings, in which some example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal example views of the inventive concepts. Accordingly, shapes of the example views may be modified according to manufacturing techniques and/or allowable errors. Therefore, the embodiments of the inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Example embodiments of aspects of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2:
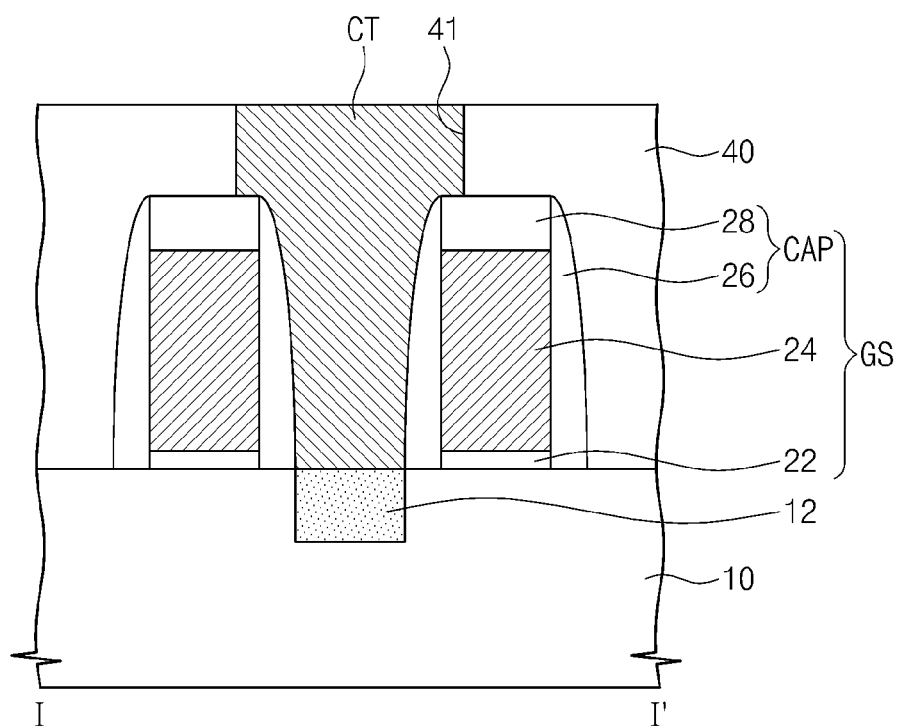
FIG. 2 is a cross-sectional view taken along a line I-I' of FIG. I to illustrate an embodiment of a semiconductor device according to the inventive concepts.

FIG. 1 is a plan view illustrating a semiconductor device according to the inventive concepts. FIG. 2 is a cross-sectional view taken along a line I-I' of FIG. 1 to illustrate an embodiment of a semiconductor device according to the inventive concepts.

Referring to FIGS. 1 and 2, a semiconductor device according to the inventive concepts may include a substrate 10, gate structures GS provided on the substrate 10 and spaced apart from each other, and a contact CT provided between the gate structures GS.

For example, the substrate 10 may be a silicon substrate, a germanium substrate, or a silicon-on-insulator (SOI) substrate. The substrate 10 may have a first conductivity type (e.g., a P-type).

Each of the gate structures GS may include a gate insulating layer 22 provided on the substrate 10, a gate electrode 24 provided on the gate insulating layer 22, and a capping pattern CAP covering a top surface and sidewalk of the gate electrode 24. The gate insulating layer 22 may include a silicon oxide layer, a silicon oxynitride layer, a metal oxide layer, or combinations thereof. The metal oxide layer may include a hafnium oxide layer, an aluminum oxide layer, a zirconium oxide layer, or combinations thereof. The gate electrode 24 may include a metal layer. In addition, the gate electrode 24 may further include a metal nitride layer that is provided between the metal layer and the gate insulating layer 22. The metal layer may include tungsten. The metal nitride layer may include at least one of a titanium nitride layer, a tantalum nitride layer, or a titanium-aluminum nitride layer. The capping pattern CAP may include a sidewall capping pattern 26 provided on the sidewalls of the gate electrode 24 and an upper capping pattern 28 provided on the top surface of the gate electrode 24. The capping pattern CAP may include at least one of a silicon nitride layer or a silicon oxynitride layer.

An impurity region 12 may be formed in the substrate 10 between the gate structures GS. The impurity region 12 may have a second conductivity type (e.g., an N-type). An insulating layer 40 may be provided on the substrate 10 to cover the gate structures GS. The insulating layer 40 may have a contact hole 41 exposing the impurity region 12. The contact hole 41 may also expose a portion of the capping pattern CAP.

The contact CT may be provided in the contact hole 41. The contact CT may include tungsten. The contact CT may further include a metal nitride layer (e.g., a titanium nitride layer, a tantalum nitride layer, or a titanium-aluminum nitride layer) provided between the tungsten and the impurity region 12. A metal silicide layer (not shown) may be additionally provided between the contact CT and the impurity region 12. The contact CT may be electrically connected to the impurity region 12 but may be insulated from the gate electrode 24 by the capping pattern CAP.

FIGS. 3A to 3G are cross-sectional views corresponding to the line I-I' of FIG. 1 to illustrate a method of forming the semiconductor device of FIG. 2.

Figure 3A:
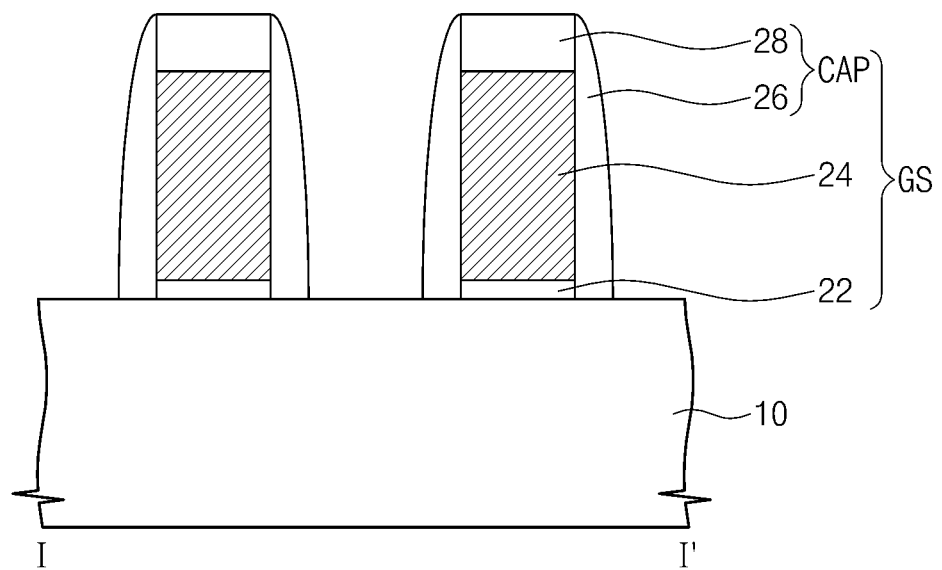
FIGS. 3A to 3G are cross-sectional views corresponding to the line I-I' of 1 to illustrate a method of forming the semiconductor device of FIG. 2.

Referring to FIG. 3A, a substrate 10 is provided. The substrate 10 may be, for example, a silicon substrate, a germanium substrate, or a SOI substrate. The substrate 10 may have a first conductivity type (e.g., a P-type).

Gate structures GS spaced part from each other may be formed on the substrate 10. Each of the gate structures GS may include a gate insulating layer 22 provided on the substrate 10, a gate electrode 24 provided on the gate insulating layer 22, and a capping pattern CAP covering a top surface and sidewalls of the gate electrode 24. The gate insulating layer 22 may include a silicon oxide layer, a silicon oxynitride layer, a metal oxide layer or combinations thereof. The metal oxide layer may include at least one of a hafnium oxide layer, an aluminum oxide layer, or a zirconium oxide layer. The gate electrode 24 may include a metal layer. The gate electrode 24 may further include a metal nitride layer provided between the metal layer and the gate insulating layer 22. The metal layer may include tungsten. The metal nitride layer may include at least one of a titanium nitride layer, a tantalum nitride layer, or a titanium-aluminum nitride layer. The capping pattern CAP may include a sidewall capping pattern 26 provided on the sidewalls of the gate electrode 24 and an upper capping pattern 28 provided on the top surface of the gate electrode 24. The capping pattern CAP may include at least one of a silicon nitride layer or a silicon oxynitride layer.

The gate structures GS may be formed by the following method. A gate insulating layer 22, a gate conductive layer (not shown), and an upper capping layer (not shown) may be sequentially formed on the substrate 10. The upper capping layer, the gate conductive layer, and the gate insulating layer 22 may be patterned to form the gate insulating layer 22, the gate electrode 24, and the upper capping pattern 28 which are sequentially stacked. Subsequently, the sidewall capping patterns 26 may be formed on sidewalls of the gate insulating layer 22, the gate electrode 24, and the upper capping pattern 28. In more detail, a sidewall capping layer (not shown) may be deposited on the gate insulating layer 22, the gate electrode 24 and the upper capping pattern 28, and the deposited sidewall capping layer may be anisotropically etched to form the sidewall capping patterns 26.

Figure 3B:
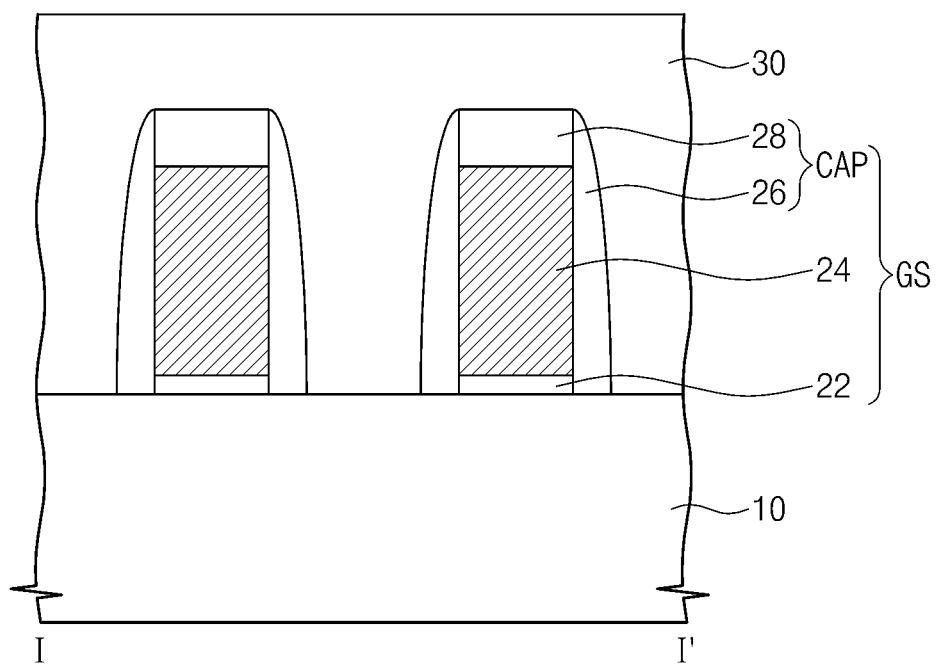

Referring to FIG. 3B, a sacrificial layer 30 may be formed on the substrate 10. The sacrificial layer 30 may cover the gate structures GS. The sacrificial layer 30 may have a high etch selectivity with respect to the capping pattern CAP during a dry etching process using a gas containing oxygen, nitrogen, and hydrogen. In the dry etching process described above, a ratio of an etch rate of the sacrificial layer 30 to an etch rate of the capping pattern CAP may be greater than a ratio of an etch rate of a silicon oxide layer to the etch rate of the capping pattern CAP. In other words, an etch selectivity of the sacrificial layer 30 to the capping pattern CAP may be greater than an etch selectivity of the silicon oxide layer to the capping pattern CAP in the dry etching process. The sacrificial layer 30 may include a carbon-containing material (e.g., a spin-on-hardmask (SOH) layer or a SiCOH layer) or a photoresist.

Figure 3C:
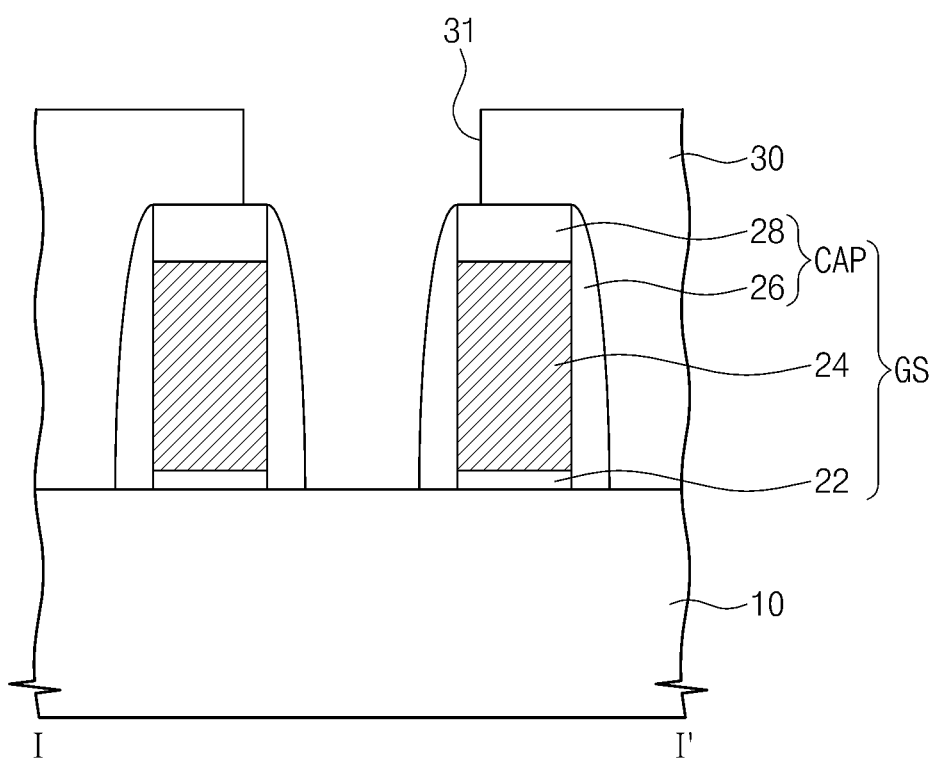

Referring to FIG. 3C, the sacrificial layer 30 may be patterned to form a preliminary contact hole 31 that exposes the substrate 10 between the gate structures GS. The preliminary contact hole 31 may be formed by the dry etching process using the gas containing oxygen, nitrogen, and hydrogen. By the high etch selectivity described above, the capping pattern CAP may be hardly etched but the sacrificial layer 30 may be easily etched. Thus, even though a distance between the gate structures GS is small and a height of the gate structures GS is great, the preliminary contact hole 31 may be easily formed without damage of the capping pattern CAP.

Figure 3D:
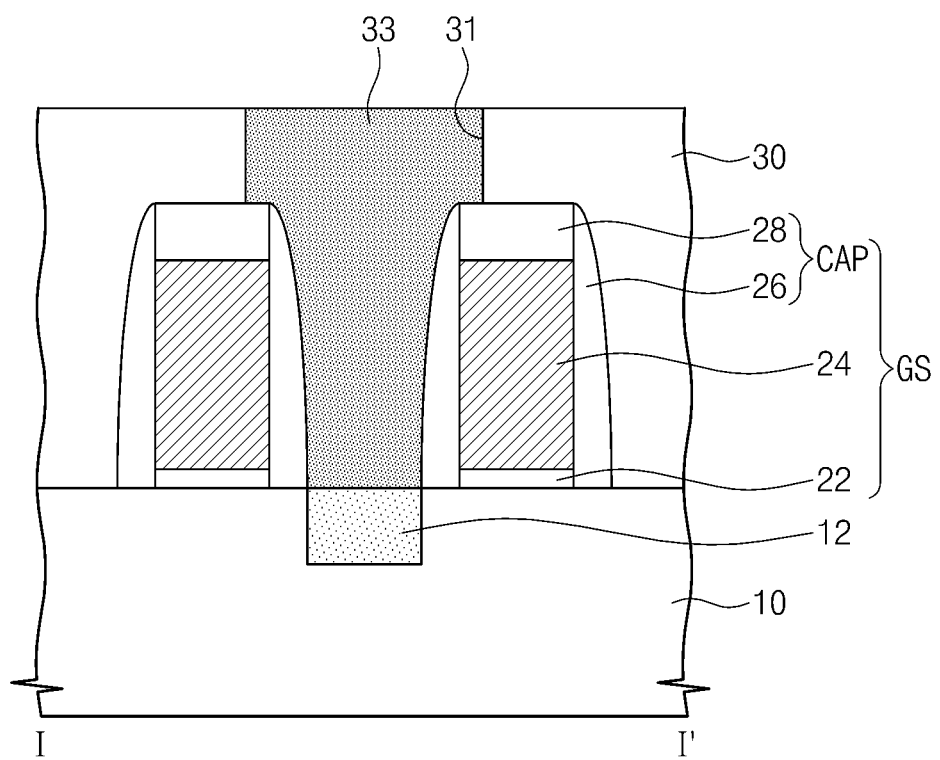

Referring to (FIG. 3D, a preliminary contact 33 may be formed in the preliminary contact hole 31. The preliminary contact 33 may include a material having an etch selectivity with respect to the sacrificial layer 30, a silicon oxide layer, and the capping pattern CAP. For example, the preliminary contact 33 may include poly-silicon or titanium nitride. The poly-silicon or the titanium nitride may be deposited at a temperature of 400° C. or less. The preliminary contact 33 outside the preliminary contact hole 31 may be removed by a planarization process.

Figure 3E:
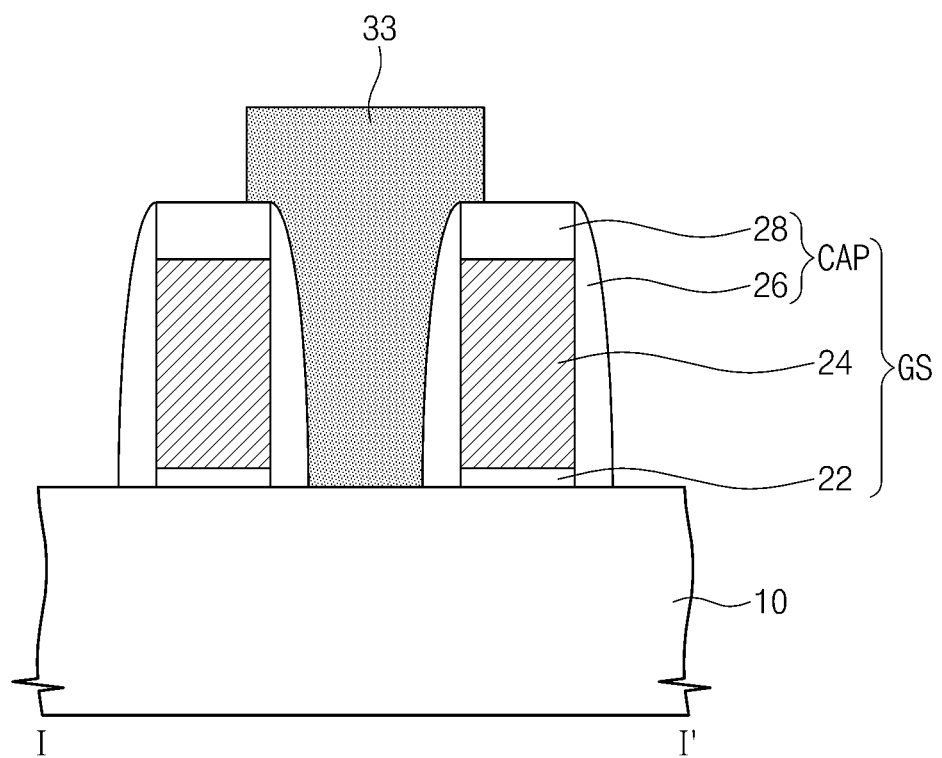

Referring to FIG. 3E, the sacrificial layer 30 may be selectively removed. The sacrificial layer 30 may be removed by an ashing process (e.g., an oxidation treatment, an ozone treatment, or an ultraviolet (UV) treatment) or a wet cleaning process.

Figure 3F:
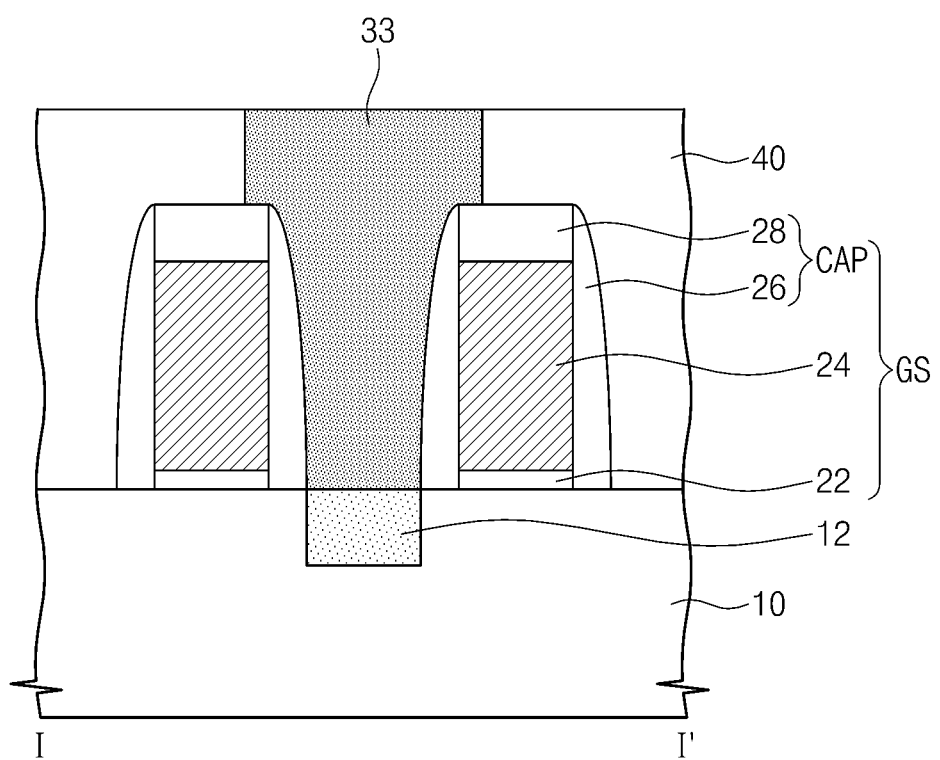

Referring to FIG. 3F, an insulating layer 40 may be formed on the substrate 10. The insulating layer 40 may cover the gate structures GS and may expose the preliminary contact 33. The insulating layer 40 may be formed of a silicon oxide layer.

Figure 3G:
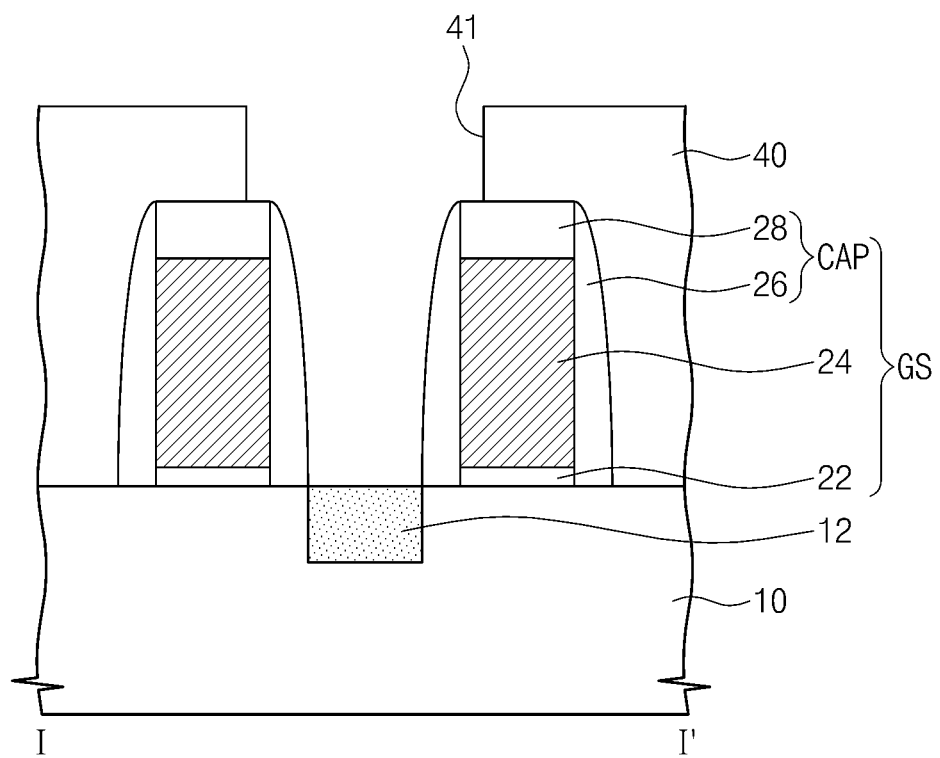

Referring to FIG. 3G, the preliminary contact 33 may be selectively removed to form a contact hole 41 exposing the substrate 10 in the insulating layer 40. If the preliminary contact 33 is formed of the poly-silicon, the preliminary contact 33 may be removed using, for example, phosphoric acid. Dopants (e.g. phosphorus) having a second conductivity type (e.g., an N-type) may be injected into the substrate 10 exposed by the contact hole 41 to form an impurity region 12.

Referring again to FIG. 2, a contact CT may be formed in the contact hole 41. The contact CT may include tungsten. The contact CT may further include a metal nitride layer (e.g., a titanium nitride layer, a tantalum nitride layer, or a titanium-aluminum nitride layer) provided between the tungsten and the impurity region 12. A metal silicide layer (not shown) may be additionally formed between the contact CT and the impurity region 12. The contact CT may be electrically connected to the impurity region 12 but may be insulated from the gate electrode 24 by the capping pattern CAP.

Figure 4:
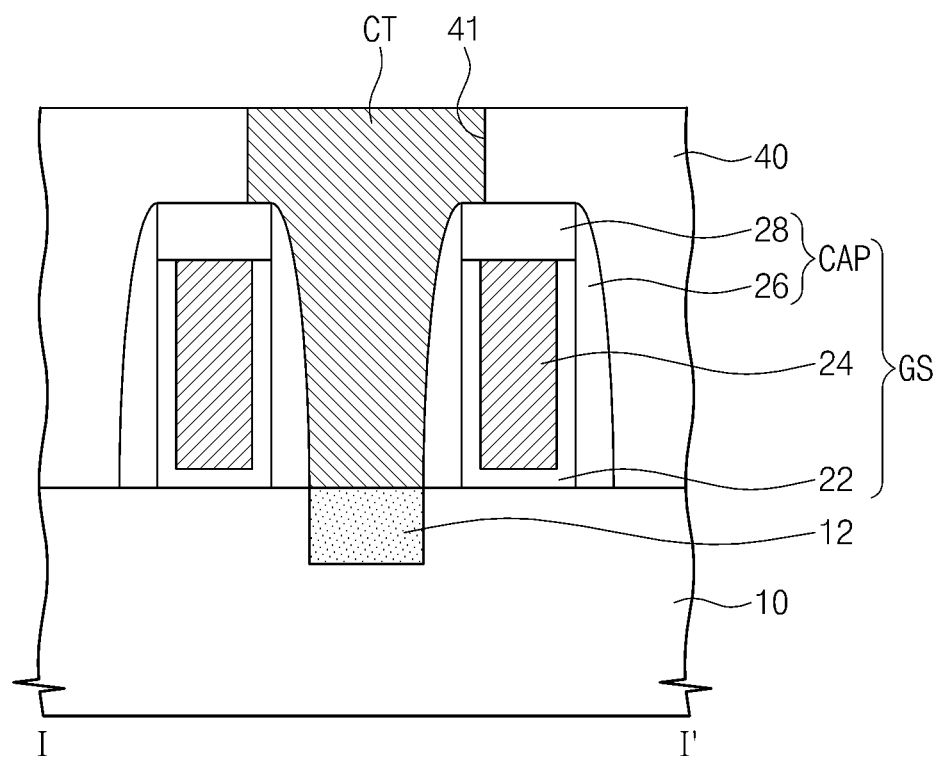
FIG. 4 is a cross-sectional view taken along the line I-I' of FIG. 1 to illustrate another embodiment of a semiconductor device according to the inventive concepts.

FIG. 4 is a cross-sectional view taken along the line I-I' of FIG. 1 to illustrate another embodiment of a semiconductor device according to the inventive concepts. In this embodiment, the descriptions to the same elements as in the embodiment of FIG. 2 will be omitted for the purpose of ease and convenience in explanation. Referring to FIGS. 1 and 4, a gate insulating layer 22 may extend between the gate electrode 24 and the sidewall capping pattern 26 in this embodiment.

Figure 5A:
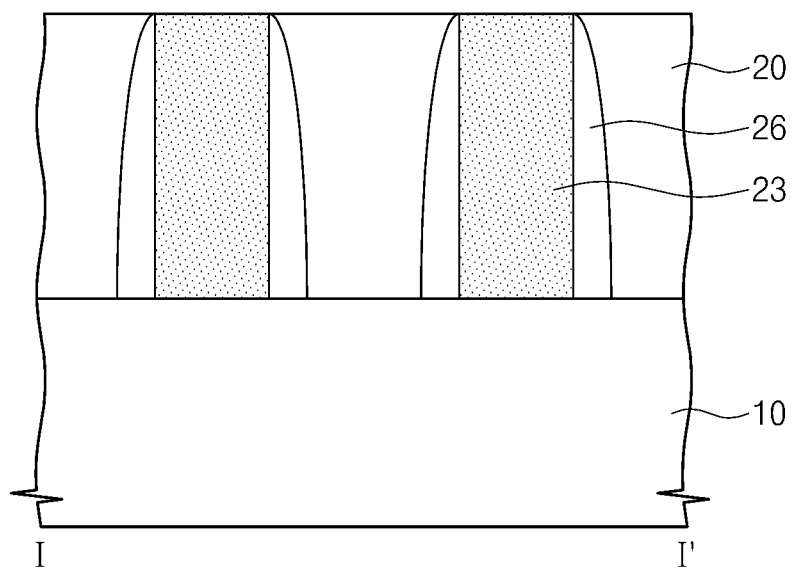
FIGS. 5A to 5C are cross-sectional views corresponding to the line I-I' of FIG. 1 to illustrate a method of forming the semiconductor device of FIG. 4 according to an example embodiment.
Figure 5B:
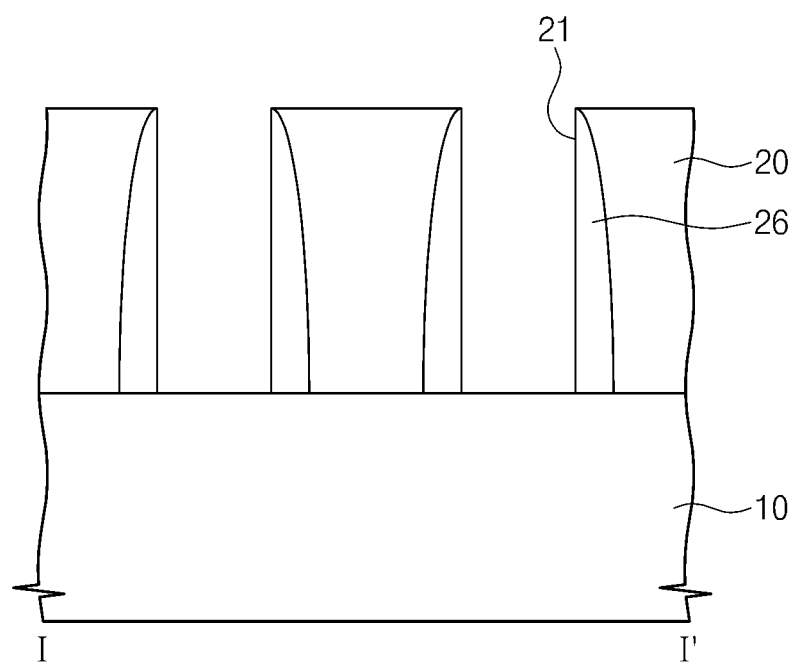
Figure 5C:
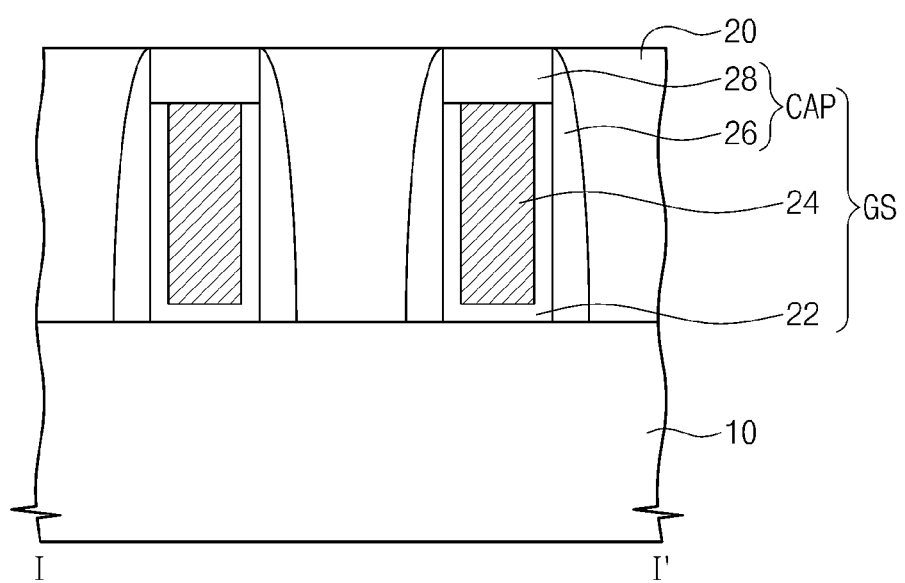

FIGS. 5A to 5C are cross-sectional views corresponding to the line I-I' of FIG. 1 to illustrate a method of forming the semiconductor device of FIG. 4. In this embodiment, each of gate structures GS may be formed by a gate last process. Hereinafter, this will be described in more detail.

Referring to FIG. 5A, mold patterns 23 spaced apart from each other may be formed on a substrate 10. The mold patterns 23 may include, for example, poly-silicon. Sidewall capping patterns 26 may be formed on sidewalls of the mold patterns 23. The sidewall capping patterns 26 may include at least one of a silicon nitride layer or a silicon oxynitride layer. A sacrificial layer 20 may be formed on the mold patterns. The sacrificial layer 20 maybe planarized to expose top surfaces of the mold patterns 23.

Referring to FIG. 5B, the mold patterns 23 may be selectively removed to form openings 21 exposing the substrate 10. The mold patterns 23 may be removed using, for example, phosphoric acid. A sidewall of the opening 21 may be one sidewall of the sidewall capping pattern 26.

Referring to FIG. 5C, a gate insulating layer 22 may be formed on the sidewalls of the opening 21 and a top surface of the substrate 10 exposed by the opening The gate insulating layer 22 may not completely fill the opening 21. A gate conductive layer (not shown) may be formed to completely fill the opening 21. The gate insulating layer 22 and the gate conductive layer (not shown) may extend onto a top surface of the sacrificial layer 20.

The gate conductive layer (not shown) and the gate insulating layer may be recessed to expose an upper region of the opening. At this time, the gate conductive layer (not shown) and the gate insulating layer 22 disposed on the top surface of the sacrificial layer 20 may be removed. A capping layer (not shown) may be formed on the sacrificial layer 20 to fill the upper region of the second opening 21. The capping layer (not shown) may be planarized until the top surface of the sacrificial layer 20 is exposed, thereby forming an upper capping pattern 28.

By the method described above, a gate structure GS may be formed to include the gate insulating layer 22, agate electrode 24, and a capping pattern CAP. The capping pattern CAP may include the upper capping pattern 28 and the sidewall capping pattern 26.

Thereafter, a contact CT may be formed by the same method as described with reference to FIGS. 3B to 3G and 2. In more detail, the sacrificial layer 30 may be additionally formed on the sacrificial layer 20, as shown in FIG. 3B. The sacrificial layers 30 and 20 may be represented by the sacrificial layer 30, in FIG. 3B. The sacrificial layer 30 may be patterned to form the preliminary contact hole 31, as shown in FIG. 3C. Thereafter, the subsequent processes described with reference to FIGS. 3D) to 3G may be performed to form the semiconductor device having the structure illustrated in FIG. 4. In an embodiment, the sacrificial layer 30 may not be additionally formed on the sacrificial layer 20 of FIG 5C, and a portion of the sacrificial layer 20 may be removed to form a preliminary contact hole corresponding to the preliminary contact hole 31. In this case, a top surface of a contact corresponding to the contact CT of FIG. 4 may be substantially coplanar with a top surface of the upper capping pattern 28.

According to a conventional art, the insulating layer 40 may be etched to form the contact hole 41 between the gate structures GS. A distance between the gate structures GS and a thickness of the capping pattern CAP may be reduced with a high integration density of semiconductor devices. In addition, a width of the contact hole 41 may also be reduced. As the width of the contact hole 41 decreases, a possibility of occurrence of a not-opened contact hole may increase during the formation of the contact hole 41. Thus, over-etching may be required to form the contact hole 41. At this time, the capping pattern CAP covering the gate electrode 24 may be damaged by the over-etching. In particular, the upper capping pattern 28 may be more damaged b over-etching. Thus, an electrical short between the contact CT and the gate electrode 24 may be caused.

According to the inventive concepts, the contact hole 41 is formed by etching the sacrificial layer having the high etch selectivity with the capping pattern CAP, not by etching the silicon oxide layer used as the insulating layer 40. Thus, even though the distance between the gate structures GS and the thickness of the capping pattern CAP are very small, a self-aligned contact (i.e., the contact CT) may be formed without a not-open phenomenon. In addition, the contact 41 may be formed by the dry etching process using the gas containing oxygen, nitrogen, and hydrogen, so the occurrence of a polymer may be reduced as compared with a conventional art.

Figure 6:
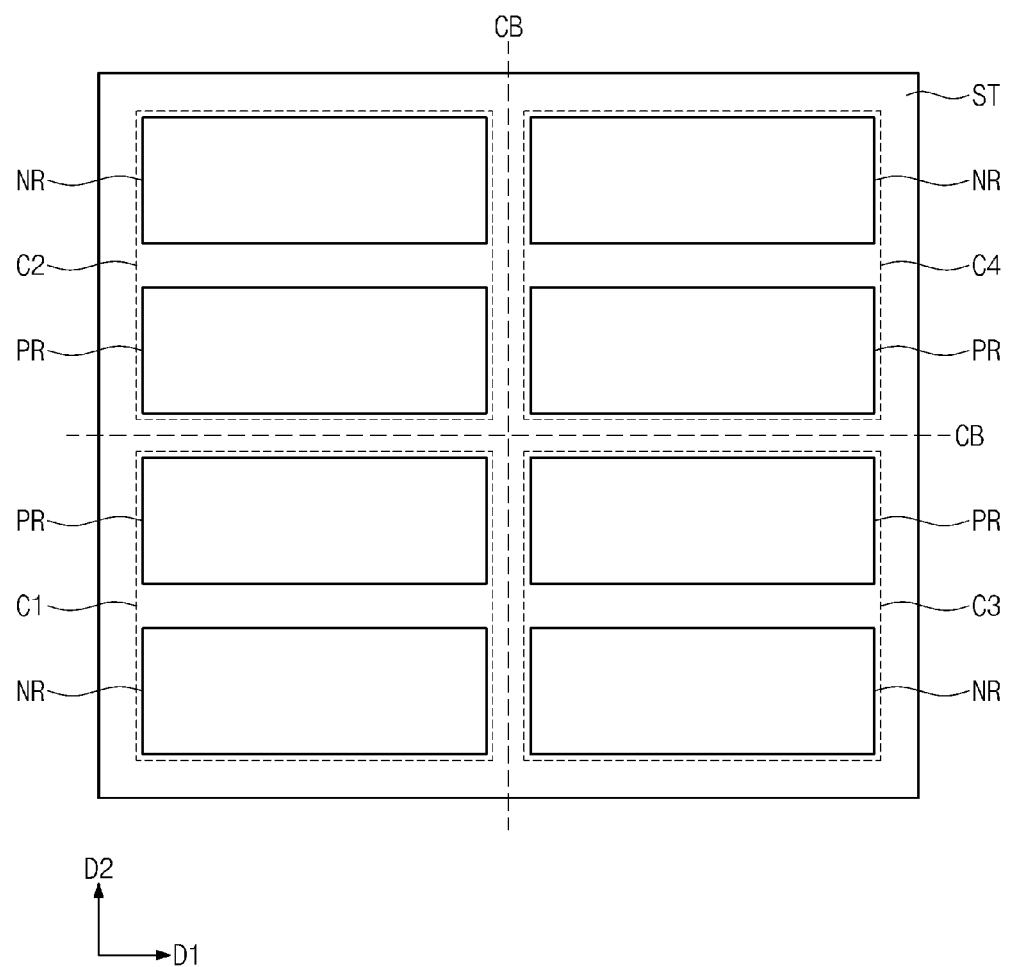
FIG. 6 is a plan view illustrating a semiconductor device according to example embodiments of the inventive concepts.

FIG. 6 is a plan view illustrating a semiconductor device according to some example embodiments of the inventive concepts.

Referring to FIG. 6, a semiconductor device according to embodiments of the inventive concepts may include a plurality of logic cells C1, C2, C3, and C4 provided on a substrate (not shown). Each of the logic cells C1, C2, C3, and C4 may include a plurality of transistors. In an embodiment, the semiconductor device may include a first logic cell C1, a third logic cell C3 spaced apart from the first logic cell C1 in a first direction D1, a second logic cell C2 spaced apart from the first logic cell C1 in a second direction D2 intersecting the first direction D1, and a fourth logic cell C4 spaced apart from the third logic cell C3 in the second direction D2. The fourth logic cell C4 may be spaced apart from the second logic cell C2 in the first direction D1. A cell boundary CB may be defined between the logic cells C1, C2, C3, and C4 adjacent to each other.

Each of the logic cells C1, C2, C3, and C4 may include active regions that are isolated from each other by a device isolation pattern ST. Each of the logic cells C1, C2, C3, and C4 may include a PMOSFET region PR and an NMOSFET region NR. The PMOSFET region PR and the NMOSFET region NR of each of the logic cells C1, C2, C3, and C4 may be isolated from each other by the device isolation pattern ST.

In an embodiment, the PMOSFET region PR. and the NMOSFET region NR may be spaced apart from each other in the second direction D2, The PMOSFET region PR of the first logic cell C1 may be adjacent to the PMOSFET region PR of the second logic cell C2 in the second direction D2. Hereinafter, in the specification, the logic cell may defined as a unit that performs one Boolean logic function (e.g., an INVERTER function, an AND function, an OR function, an NAND function, or an NOR function) or one storage function (e.g., a FLIP-FLOP function). Four logic cells C1 C2, C3, and C4 are illustrated in FIG. 6. However, the inventive concepts are not limited thereto.

Figure 7:
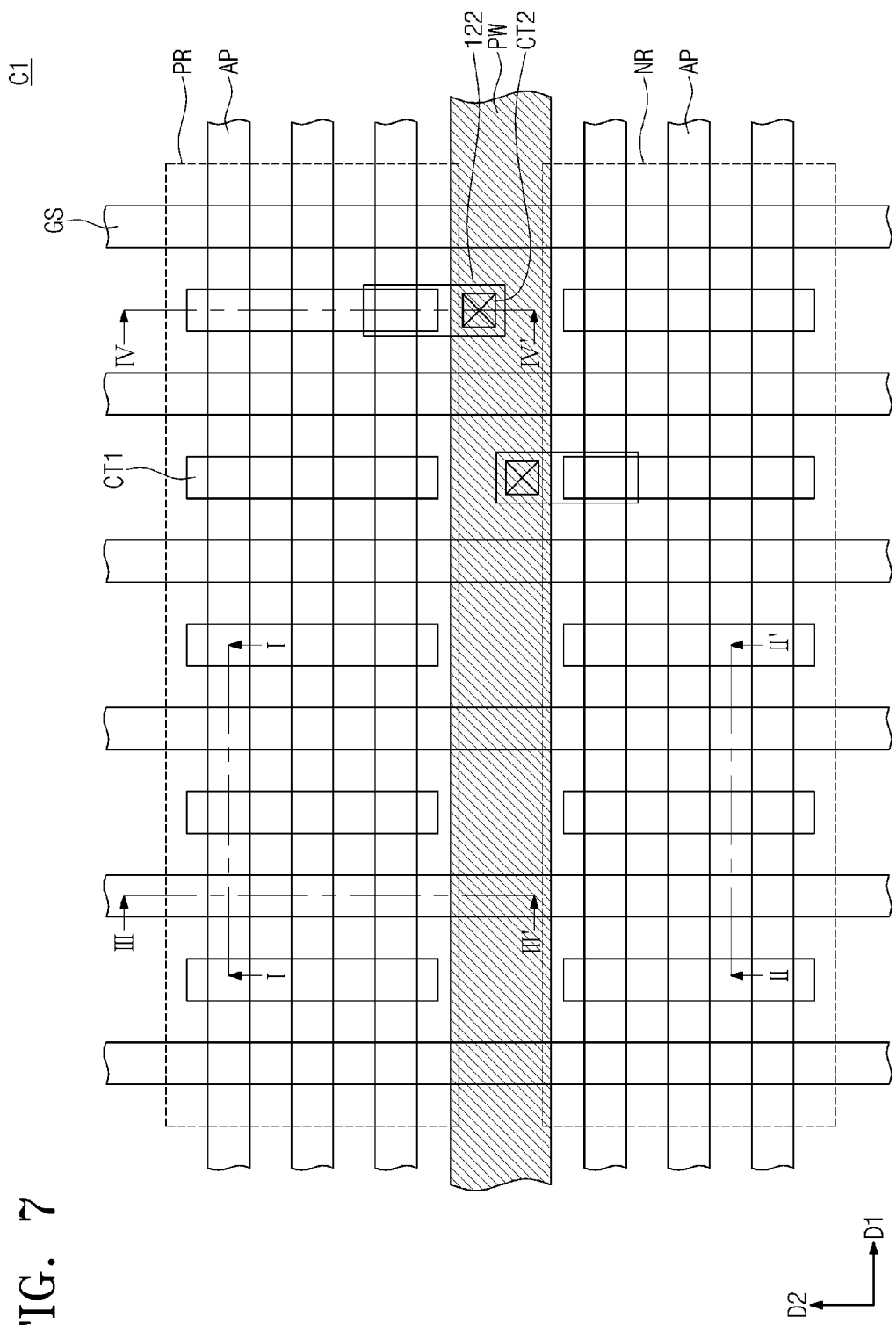
FIG. 7 is a plan view illustrating a portion of logic cells of FIG. 6.
Figure 8A:
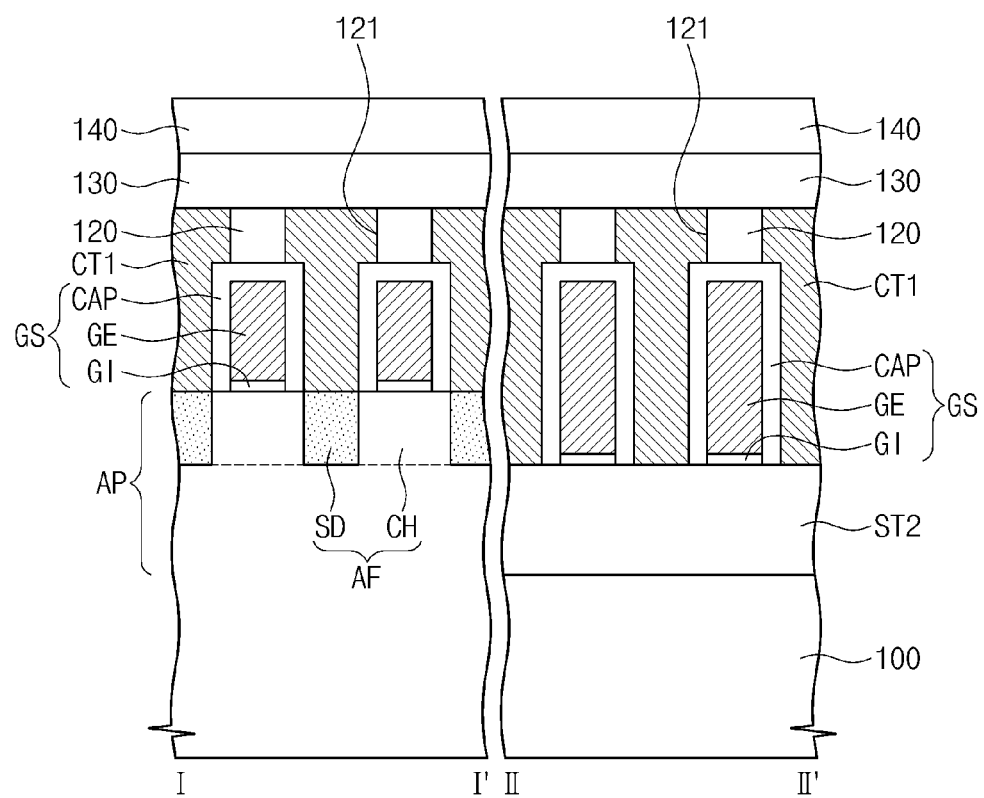
FIG. 8A is a cross-sectional view taken along lines I-I' and II-II' of FIG. 7.
Figure 8B:
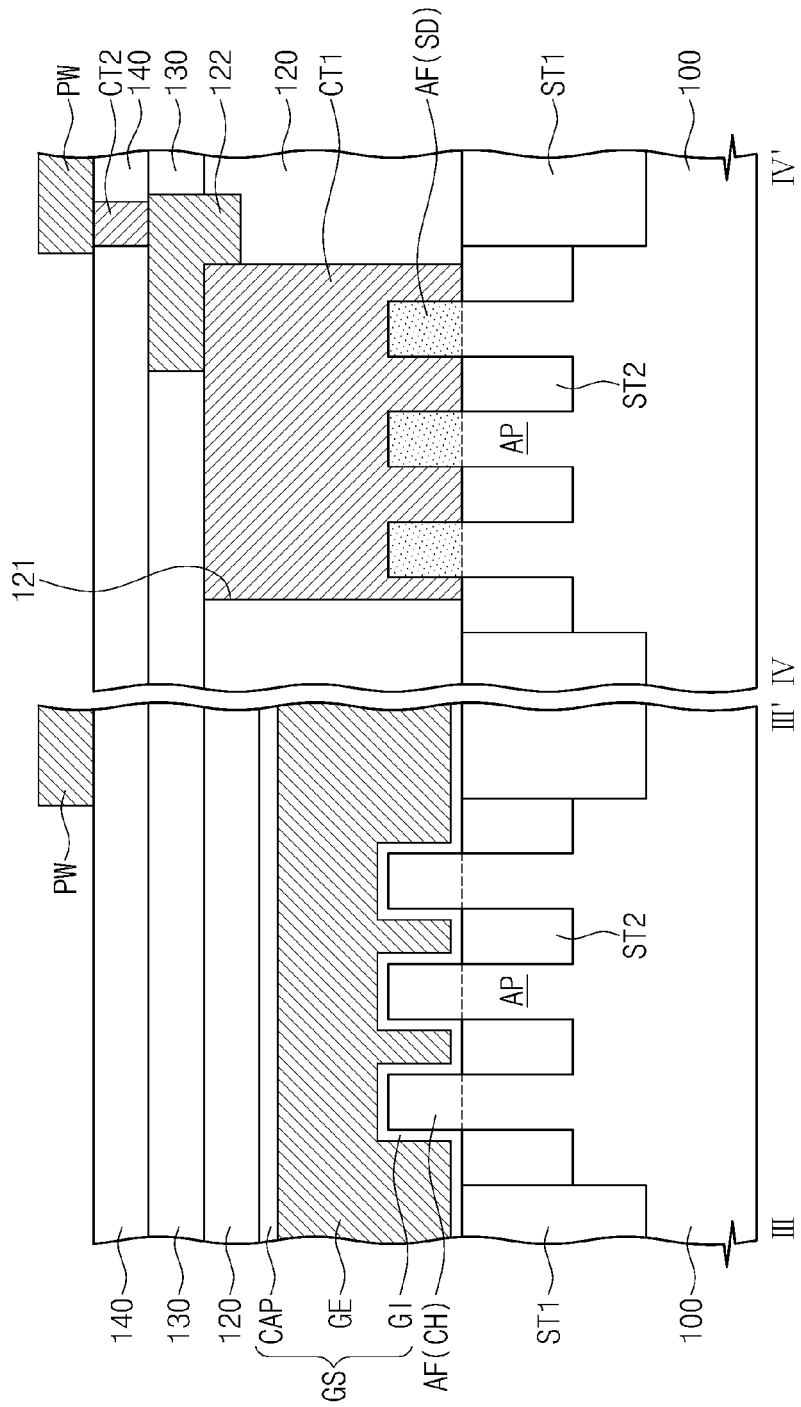
FIG. 8B is a cross-sectional view taken along lines III-III' and IV-IV' of FIG. 7.
Figure 9A:
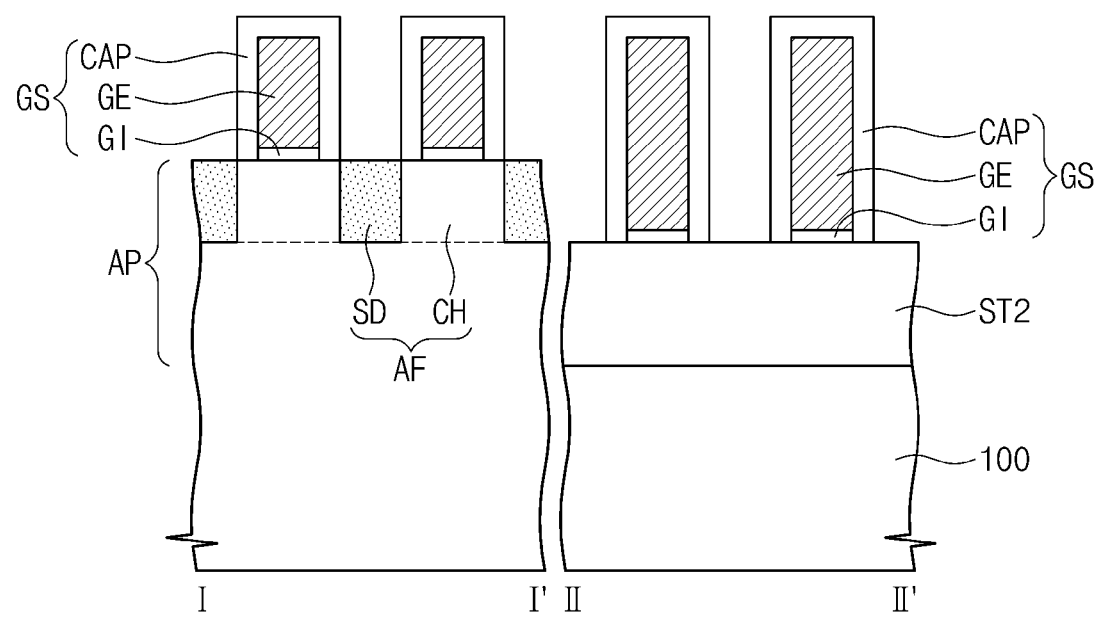
Figure 9B:
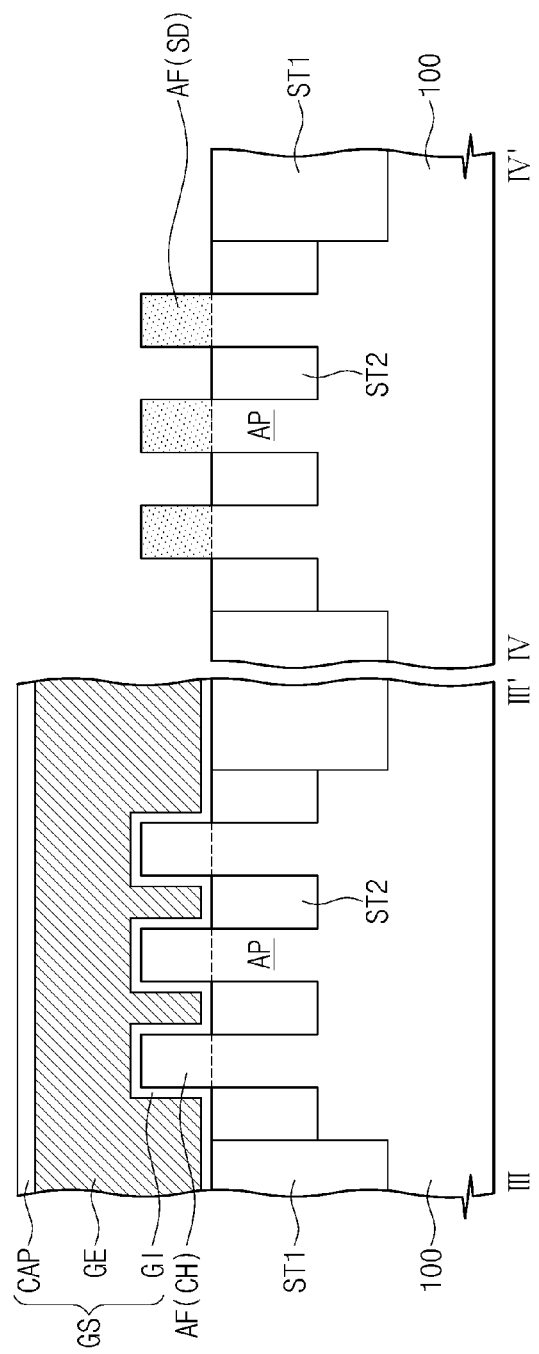

FIG. 7 is a plan view illustrating a portion of logic cells of FIG. 6. FIG. 8A is a cross-sectional view taken along lines I-I' and II-II' of FIG. 7, and FIG. 8B is a cross-sectional view taken along lines III-III' and IV-IV' of FIG. 7. Hereinafter, embodiments of the inventive concepts are described on the basis of the first logic cell C1. However, other logic cells C2, C3, and C4 may have the same structure as or a corresponding structure to the first logic cell C1.

Referring to FIGS. 7, 8A, and 8B, a device isolation pattern ST may be formed in a substrate 100 to define active regions. The substrate 100 may be, for example, a silicon substrate, a germanium substrate, or a silicon-on-insulator (SOD substrate. The substrate 100 may have a first conductivity type (e.g., a P-type), The device isolation pattern ST may include, for example, a silicon oxide layer. The active regions may include the PMOSFET region PR and the NMOSFET region NR which are isolated from each other by the device isolation pattern ST.

The device isolation pattern ST may include a first device isolation pattern ST1 that isolates the PMOSFET region PR and the NMOSFET region NR from each other. According to an embodiment, the PMOSFET region PR and the NMOSFET region NR may be spaced apart from each other in the second direction D2 with the first device isolation pattern ST1 interposed therebetween. The first device isolation pattern ST1 may extend in the first direction D1 to isolate the PMOSFET region PR and the NMOSFET region NR from each other. Each of the PMOSFET region PR and the NMOSFET region NR is shown as one region in FIG. 7. Alternatively, each of the PMOSFET region PR and the NMOSFET region NR may include a plurality of regions isolated by the first device isolation pattern ST1.

The device isolation pattern ST may further include a second device isolation pattern ST2 that defines active patterns AP in the PMOSFET region PR and the NMOSFET region NR. The second device isolation pattern ST2 may extend in the first direction D1. Thus, the active patterns AP may extend in the first direction D1 and may be spaced apart from each other in the second direction D2. Each of the active patterns AP may have upper region (hereinafter, referred to as 'an active fin AF') that is exposed by the second device isolation pattern ST2. As shown in FIG. 7, three active patterns AP are disposed in each of the PMOSFET and NMOSFET regions PR and NR. However, the inventive concepts are not limited thereto.

The device isolation pattern ST may include a third device isolation pattern (not shown) that isolates the adjacent logic cells C1, C2, C3, and the C4 from each other. The first device isolation pattern ST1, the second device isolation pattern ST2, and the third device isolation pattern may be connected to each other to constitute one united body.

The first and second device isolation patterns ST1 and ST2 may have depths in a direction perpendicular to a top surface of the substrate 100. According to an embodiment, the depth of the second device isolation layer ST2 may be smaller than the depth of the first device isolation layer ST1.

Gate structures GS may be provided on the substrate 100. The gate structures GS may extend in the second direction D2 to intersect the active fins AF. The gate structures GS may be spaced apart from each other in the first direction D1. Each of the gate structures GS may extend in the second direction D2 to intersect the PMOSFET region PR and the NMOSFET region NR. Each of the gate structures GS may include a gate insulating layer GI and a gate electrode GE which are sequentially stacked on the substrate 100. Each of the gate structures GS may further include a capping pattern CAP covering a top surface and sidewalls of the gate electrode GE. The gate insulating layer GI may include a silicon oxide layer, a silicon oxynitride layer, a metal oxide layer or combinations thereof. The metal oxide layer may include a hafnium oxide layer, an aluminum oxide layer, a zirconium oxide layer or combinations thereof. The gate electrode GE may include a metal layer. The gate electrode GE may further include a metal nitride layer disposed between the metal layer and the gate insulating layer GI, The metal layer may include tungsten. The metal nitride layer may include a titanium nitride layer, a tantalum nitride layer, a titanium-aluminum nitride layer or combinations thereof. The capping pattern CAP may include at least one of a silicon nitride layer or a silicon oxynitride layer. Each of the gate structures GS may have the structure described with reference to FIG. 2 or 4. For example, the capping pattern CAP may include the upper capping pattern and the sidewall capping pattern, as illustrated in FIGS. 2 and 4. Unlike FIG. 8A, the gate insulating layer GI may extend between the gate electrode GE and the sidewall capping pattern of the capping pattern CAP as described with reference to FIG. 4.

Source/drain regions SD may be formed in the active fins AF at both sides of each of the gate structures GS. The source/drain regions SD may be confined in the active fins AF, as illustrated in FIGS. 8A and 8B. Alternatively, the source/drain regions SD may extend into the active patterns AP between the second device isolation patterns ST2. Upper portions of the active patterns AP disposed under the gate structures GS may be used as channel regions CH.

A first interlayer insulating layer 120 covering the gate structures GS may be provided on the substrate 100. The first interlayer insulating layer 120 may include a silicon oxide layer.

First contact holes 121 penetrating the first interlayer insulating layer 120 may be provided at both sides of each of the gate structures GS. According to an embodiment, the first contact holes 121 may expose the source/drain regions SD. At least one of the first contact holes 121 may extend in the second direction D2 to expose a plurality of the source/drain regions SD spaced apart from each other in the second direction D2. According to an embodiment, at least one of the first contact holes 121 may expose the source/drain regions SD spaced apart from each other in the second direction D2 and the second device isolation patterns ST2 disposed between the source/drain regions SD in the NMOSFET region NR. Even though not shown in the drawings, at least one of the first contact holes 121 may expose the source/drain regions SD spaced apart from each other in the second direction D2 in the PMOSFET region PR.

First contacts CT1 may be provided in the first contact holes 121, respectively. The first contact CT1 may include tungsten. The first contact CTI may further include a metal nitride layer (e.g., a titanium nitride layer, a tantalum nitride layer, or a titanium-aluminum nitride layer) disposed between the tungsten and the source/drain regions SD. A metal silicide layer (not shown) may be additionally provided between the first contact CT1 and the source/drain regions SD. The first contact CT1 may be electrically connected to the source/drain regions SD and may be insulated from the gate electrode GE by the capping pattern CAP. The first contact CTI may be in contact with the second device isolation patterns ST2 disposed between the source/drain regions SD.

A second interlayer insulating layer 130 may be provided on the first interlayer insulating layer 120. The second interlayer insulating layer 130 may include a silicon oxide layer. A contact pad 122 may penetrate the second interlayer insulating layer 130 so as to be connected to at least e of the first contacts CT1. The contact pad 122 may include a metal and/or a conductive metal nitride.

A third interlayer insulating layer 140 may be provided on the second interlayer insulating layer 130. The third interlayer insulating layer 140 may include a silicon oxide layer. A second contact CT2 may penetrate the third interlayer insulating layer 140 so as to be connected to the contact pad 122. The second contact CT2 may include a metal and/or a conductive metal nitride.

A common conductive line PW may be provided on the third interlayer insulating layer 140. The common conductive line PW may extend in the first direction D1 and may be connected to the second contact CT2. The common conductive line PW may be shared by the PMOSFET region PR and the NMOSFET region NR adjacent to each other. Alternatively, the common conductive line PW may not be shared by the PMOSFET region PR and the NMOSFET region NR. The common conductive line PW may apply a drain voltage (e.g., a power voltage) or a ground voltage to the source/drain regions SD.

FIGS. 9A to 16A are cross-sectional views corresponding to the lines I-I' and II-II' of FIG. 7 to illustrate a method of forming a semiconductor device according to some example embodiments of the inventive concepts. FIGS. 913 to 1613 are cross-sectional views corresponding to the lines III-III' and IV-IV' of FIG. 7 to illustrate a method of forming a semiconductor device according to some example embodiments of the inventive concepts, Referring to FIGS. 9A and 9B, a device isolation pattern ST may be formed in a substrate 100 to define active regions. The substrate 100 may be, for example, a silicon substrate, a germanium substrate, or a silicon-on-insulator (SOI) substrate. The substrate 100 may have a first conductivity type (e.g., a P-type). The device isolation pattern ST may be formed by a shallow-trench isolation (ST1) technique and may include a silicon oxide layer. The active regions may include a PMOSFET region PR and an NMOSFET region NR which are isolated from each other by the device isolation pattern ST.

The device isolation pattern ST may include a first device isolation pattern ST1 isolating the PMOSFET region PR and the NMOSFET region NR from each other. According to an embodiment, the PMOSFET region PR and the NMOSFET region NR may be spaced apart from each other in the second direction D2 with the first device isolation pattern ST1 interposed therebetween. The first device isolation pattern STI may extend in the first direction D1 to isolate the PMOSFET region PR and the NMOSFET region NR from each other.

The device isolation pattern ST may further include a second device isolation pattern ST2 defining active patterns AP in the PMOSFET region PR and the NMOSFET region NR. The second device isolation pattern ST2 may extend in the first direction D1. Thus, the active patterns AP may extend in the first direction D1 and may be spaced apart from each other in the second direction D2. Each of the active patterns AP may have an upper region (i.e., an active fin AF) exposed by the second device isolation pattern ST2.

The first and second device isolation patterns ST1 and ST2 may have depths in a direction perpendicular to a top surface of the substrate 100. According to an embodiment, the depth of the second device isolation pattern ST2 may be smaller than the depth of the first device isolation pattern ST1.

Gate structures GS intersecting the active fins AF and extending in the second direction D2 may be formed on the substrate 100. The gate structures GS may be spaced apart from each other in the first direction D1. Each of the gate structures GS may extend in the second direction D2 to intersect the PMOSFET region PR and the NMOSFET region NR.

Each of the gate structures GS may include a gate insulating layer GI and a gate electrode GE which are sequentially stacked on the substrate 100. Each of the gate structures GS may further include a capping pattern CAP covering a top surface and sidewall. Is of the gate electrode GE. The gate insulating layer GI may include a silicon oxide layer, a silicon oxynitride layer, a metal oxide layer or combinations thereof. The metal oxide layer may include a hafnium oxide layer, an aluminum oxide layer, a zirconium oxide layer or combinations thereof. The gate electrode GE may include a metal layer. The gate electrode GE may further include a metal nitride layer disposed between the metal layer and the gate insulating layer GI. The metal layer may include tungsten. The metal nitride layer may include a titanium nitride layer, a tantalum nitride layer, a titanium-aluminum nitride layer or combinations thereof. The capping pattern CAP may include at least one of a silicon nitride layer or a silicon oxynitride layer.

Each of the gate structures GS may have the structure illustrated in FIG. 2. In this case, each of the gate structures GS may be formed by the method described with reference to FIG. 3A. Alternatively, each of the gate structures GS may have the structure illustrated in FIG. 4. In this case, each of the gate structures GS may be formed by the method described with reference to FIGS. 5A to 5C.

Source/drain regions SD may be formed in the active fins AF at both sides of each of the gate structures GS. Upper portions of the active patterns AP disposed under the gate structures GS may be used as channel regions CH. In the PMOSFET region PR, the source/drain regions SD may be formed by injecting P-type dopants. In the NMOSFET region NR, the source/drain regions SD may be formed by injecting N-type dopants.

Figure 10A:
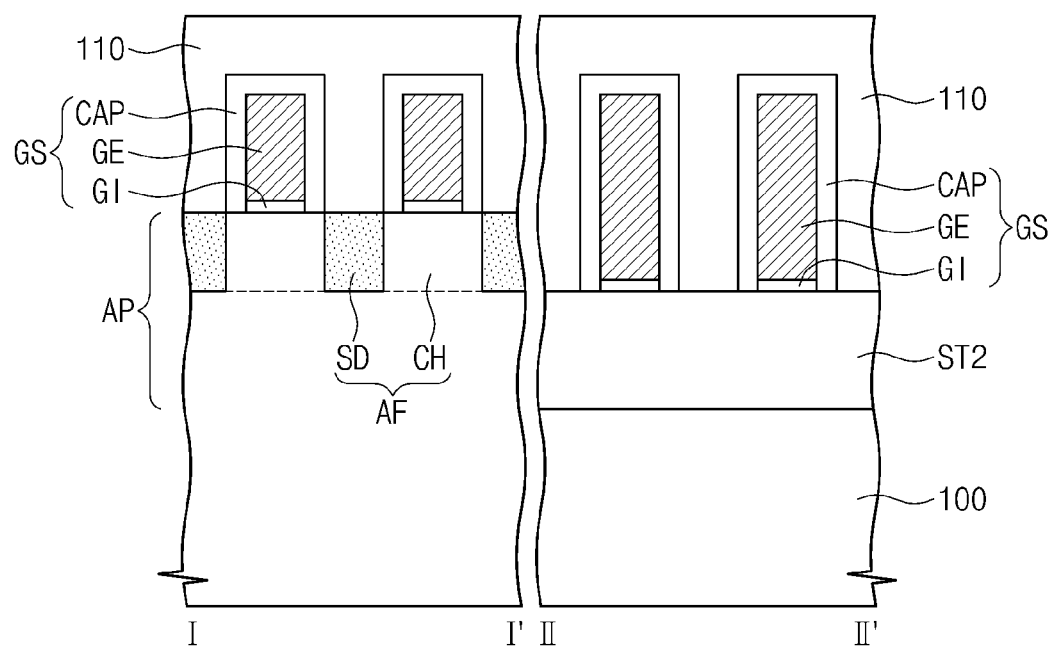
Figure 10B:
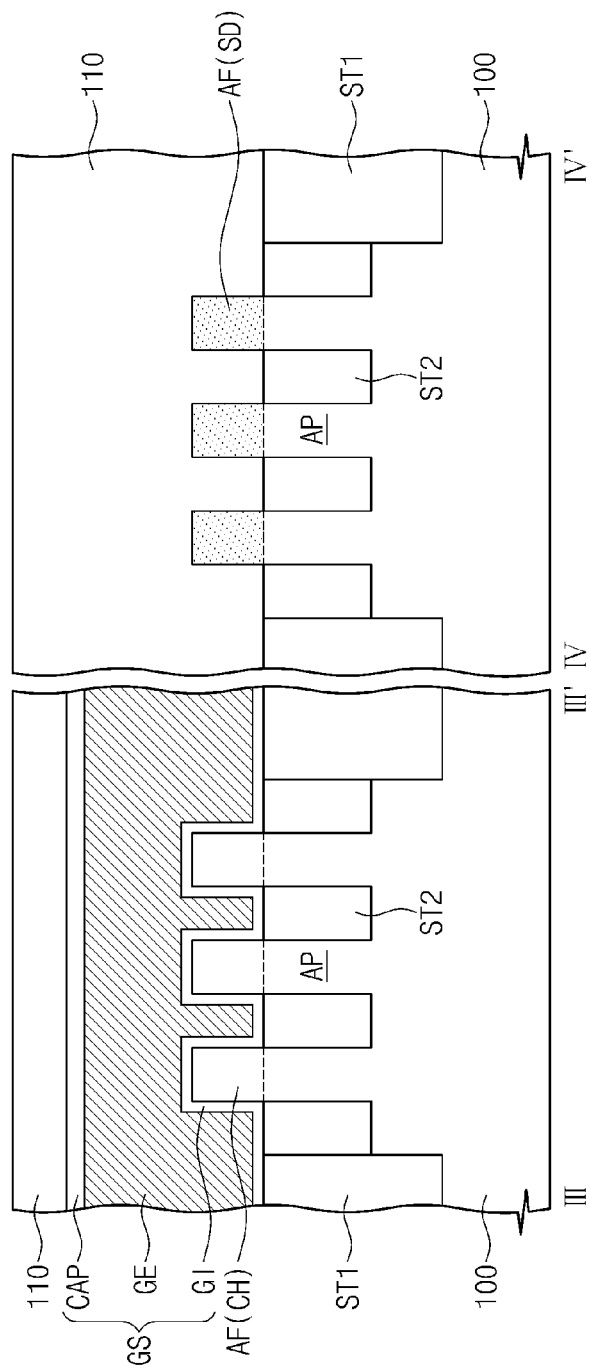

Referring to FIGS. 10A and 10B, a sacrificial layer 110 may be formed on the substrate 100. The sacrificial layer 110 may cover the gate structures GS. The sacrificial layer 110 may have a high etch selectivity with respect to the capping pattern CAP during a dry etching process using a gas containing oxygen, nitrogen, and hydrogen. A ratio of an etch rate of the sacrificial layer 110 to an etch rate of the capping pattern CAP may be greater than a ratio of an etch rate of a silicon oxide layer to the etch rate of the capping pattern CAP in the dry etching process described above. In other words, an etch selectivity of the sacrificial layer 110 to the capping pattern CAP may be greater than an etch selectivity of the silicon oxide layer to the capping pattern CAP in the dry etching process. The sacrificial layer 110 may include a carbon-containing material (e.g., a spin-on-hardmask (SOH) layer or a SiCOH layer) or a photoresist.

Figure 11A:
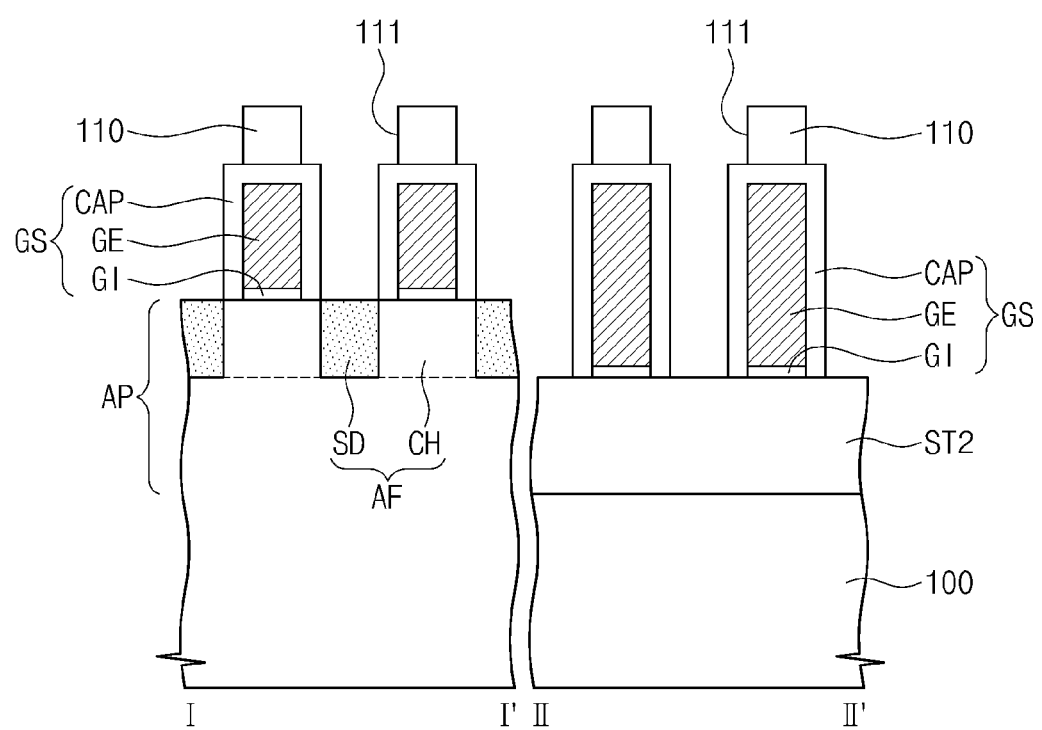
Figure 11B:
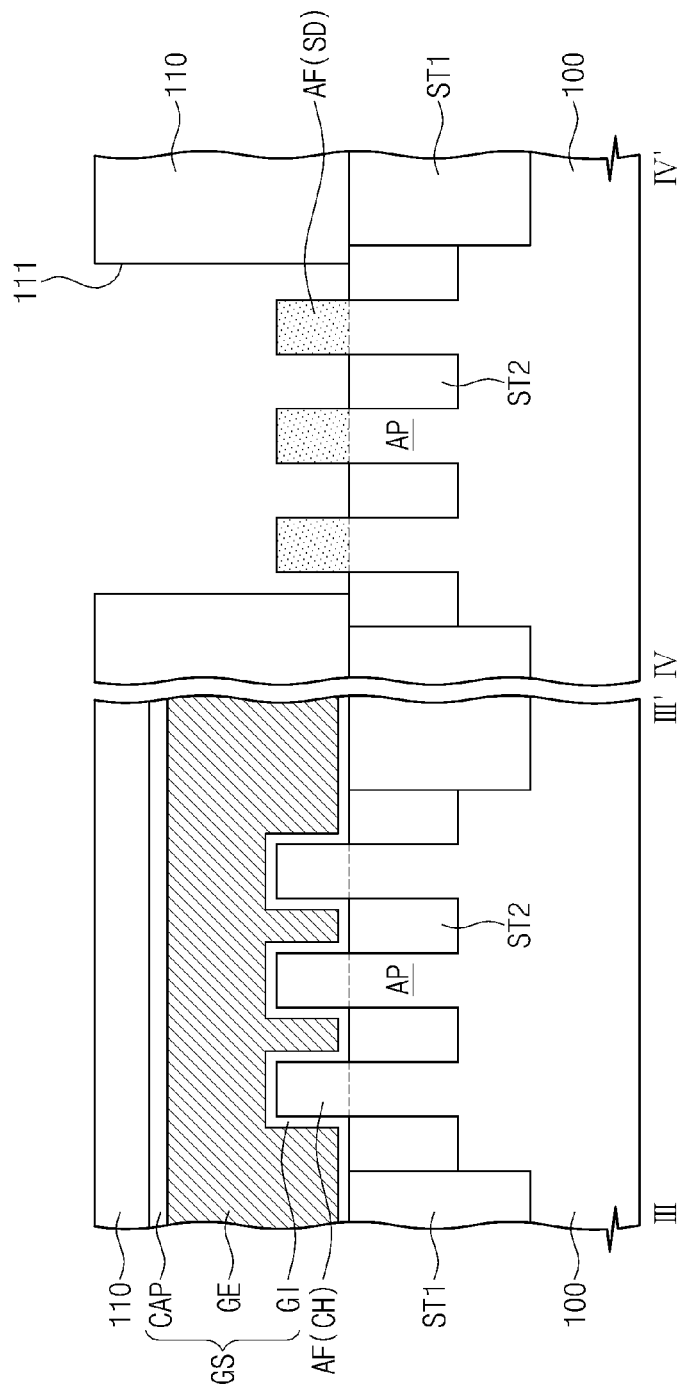

Referring to FIGS. 11A and 11B, the sacrificial layer 110 may be patterned to form a preliminary contact hole 111 exposing the substrate 100 between the gate structures GS. For example, the preliminary contact hole 111 may expose the source/drain regions SD and the second device isolation patterns ST2 disposed between the source/drain regions SD. The preliminary contact hole 111 may be formed by the dry etching process using the gas containing oxygen, nitrogen, and hydrogen. By the high etch selectivity described above, the capping pattern CAP may be hardly etched but the sacrificial layer 110 may be easily etched. Thus, even though a distance between the gate structures GS is small and a height of the gate structures GS is great, the preliminary contact hole 111 may be easily formed without damage of the capping pattern CAP.

Figure 12A:
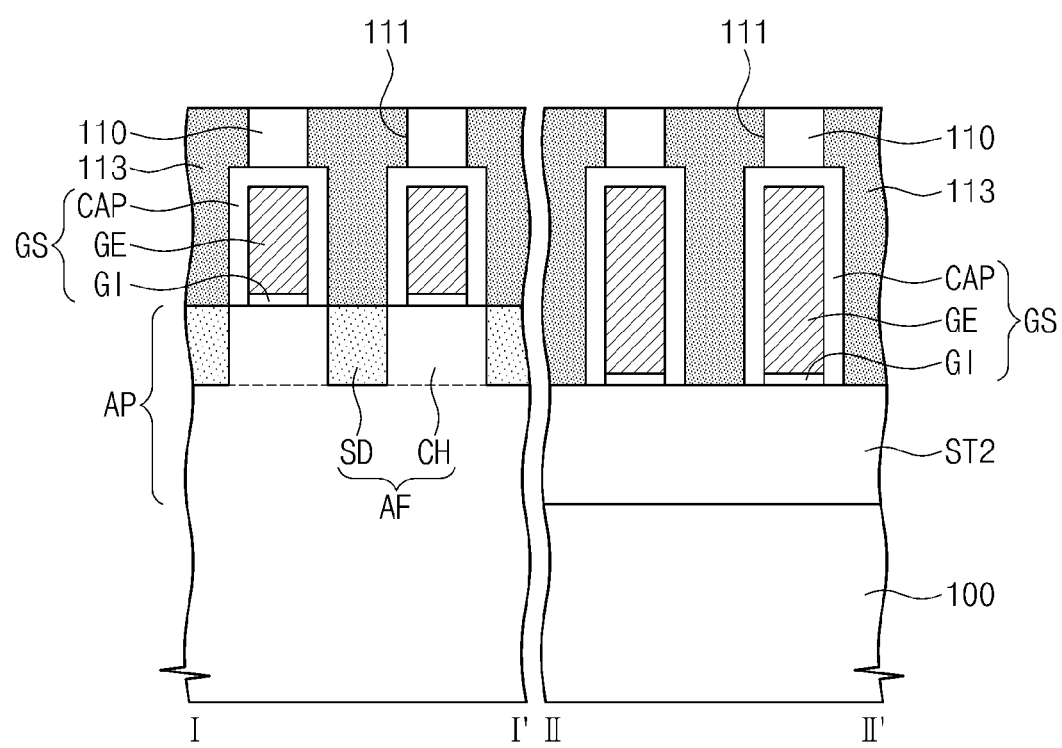
Figure 12B:
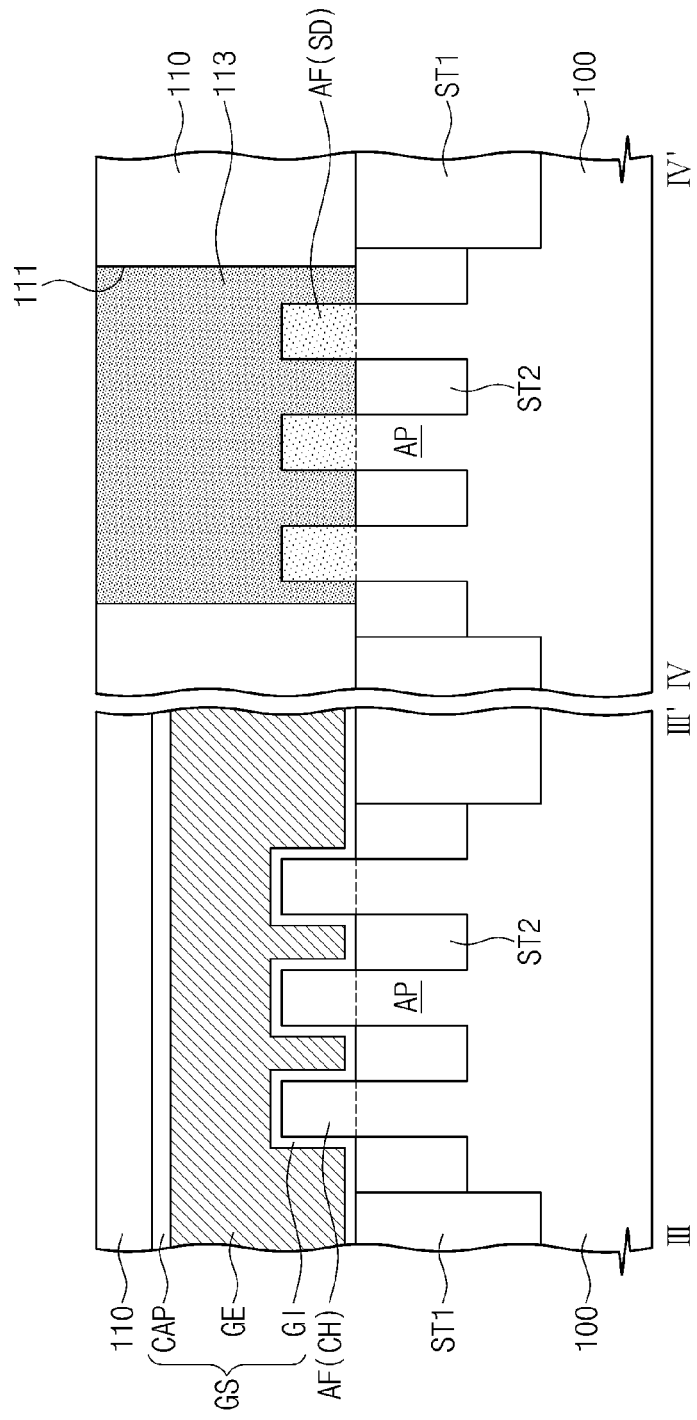

Referring to FIGS. 12A and 12B, a preliminary contact 113 may be formed in the preliminary contact hole 111. The preliminary contact 113 may be in contact with the source/drain regions SD and the second device isolation patterns ST2 between the source/drain regions SD. The preliminary contact 113 may include a material having an etch selectivity with respect to the sacrificial layer 110, a silicon oxide layer and the capping pattern CAP. For example, the preliminary contact 113 may include poly-silicon or titanium nitride. The poly-silicon or the titanium nitride may be deposited at a temperature of 400° C. or less. The preliminary contact 113 disposed outside the preliminary contact hole 111 may be removed by a planarization process.

Figure 13A:
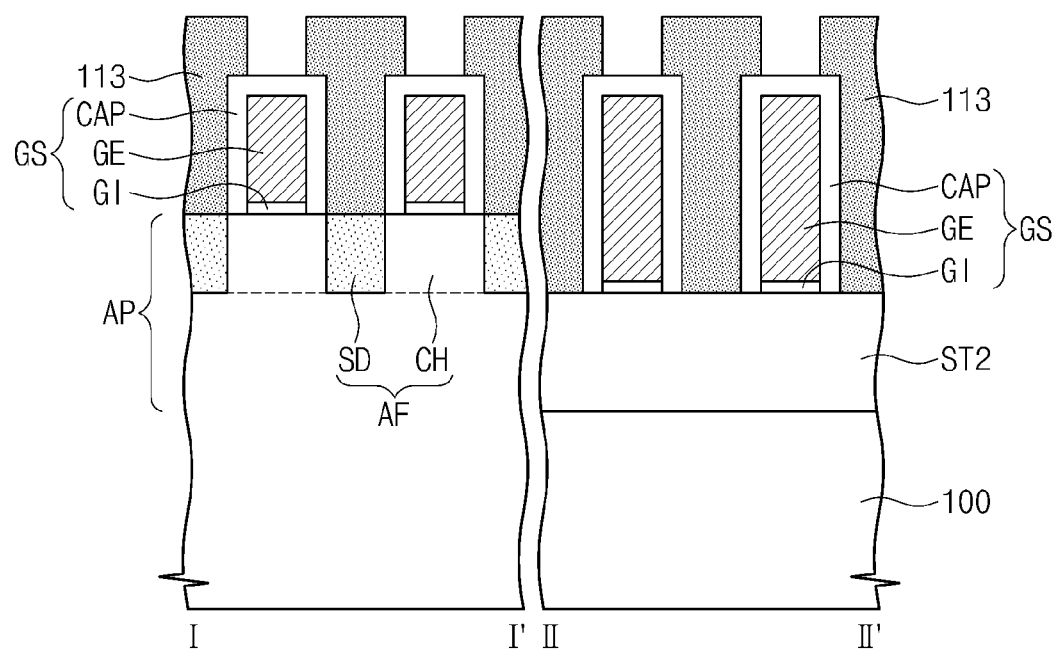
Figure 13B:
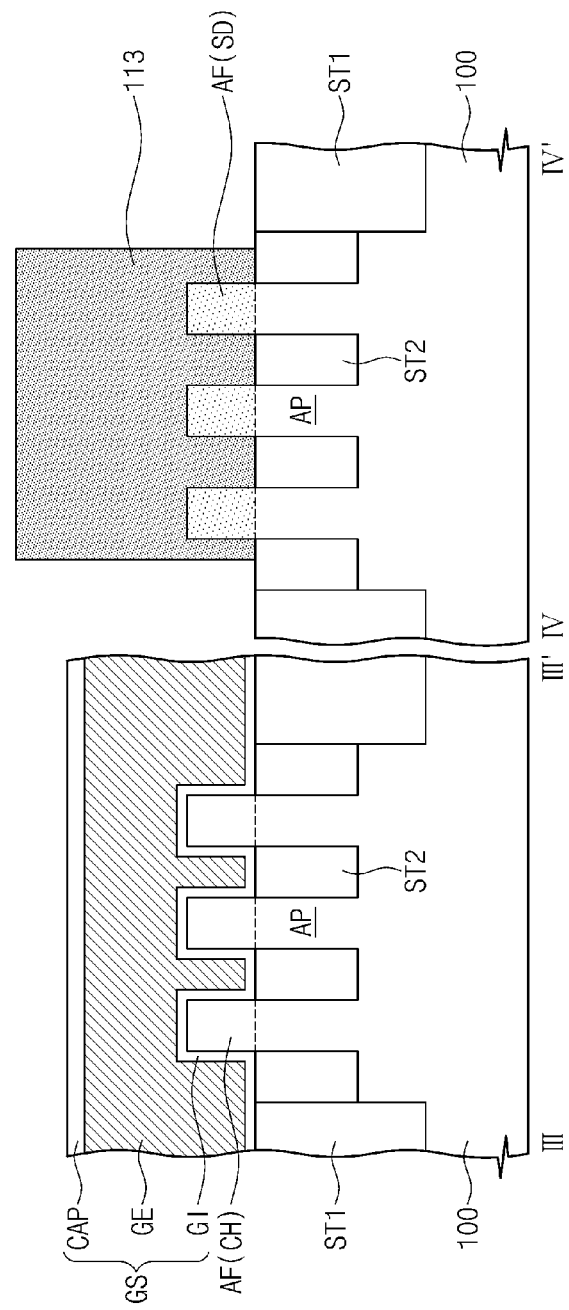

Referring to FIGS. 13A and 1313, the sacrificial layer 110 may be selectively removed. The sacrificial layer 110 may be removed by an ashing process (e.g., an oxidation treatment, an ozone treatment, or an ultraviolet (UV) treatment) or a wet cleaning process.

Figure 14A:
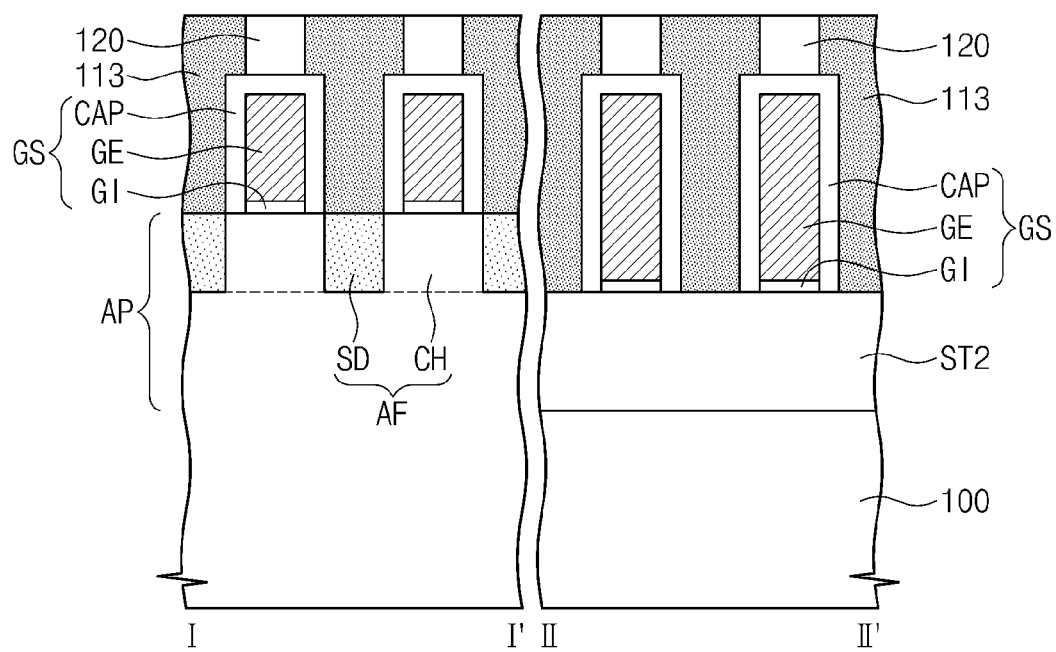
Figure 14B:
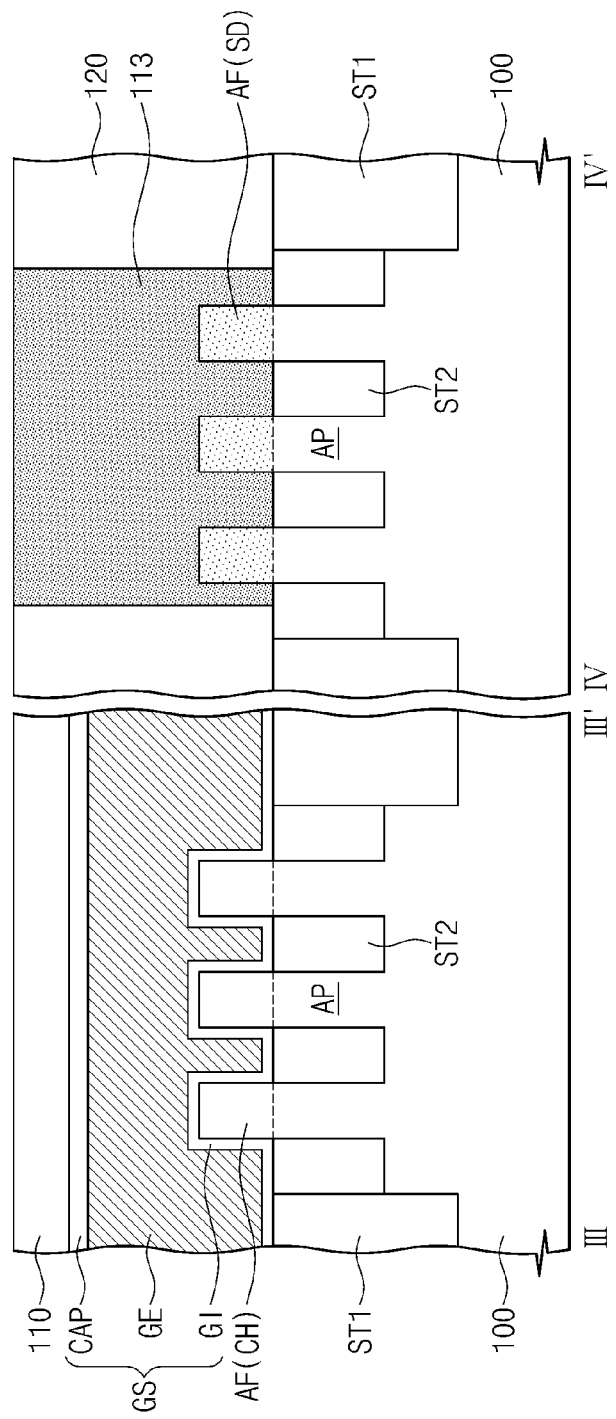

Referring to FIGS. 14A and 14B, a first interlayer insulating layer 120 may be formed to cover the gate structures GS and to expose the preliminary contact 113. The first interlayer insulating layer 120 may be a silicon oxide layer.

Figure 15A:
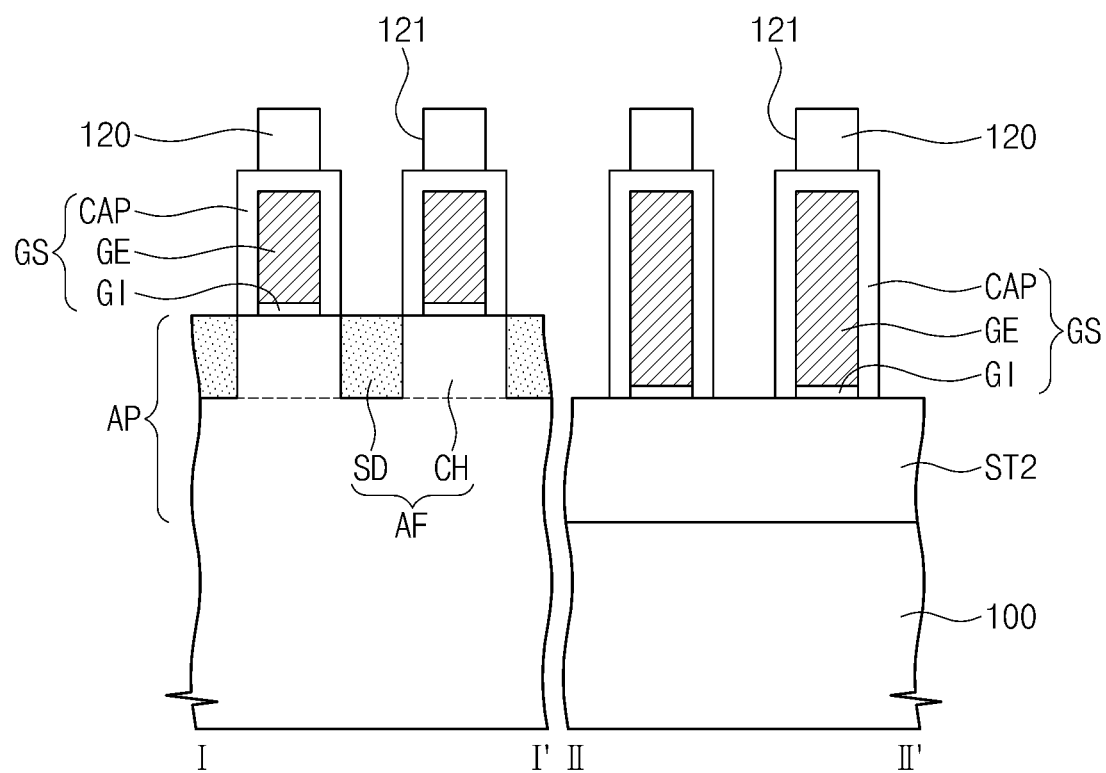
Figure 15B:
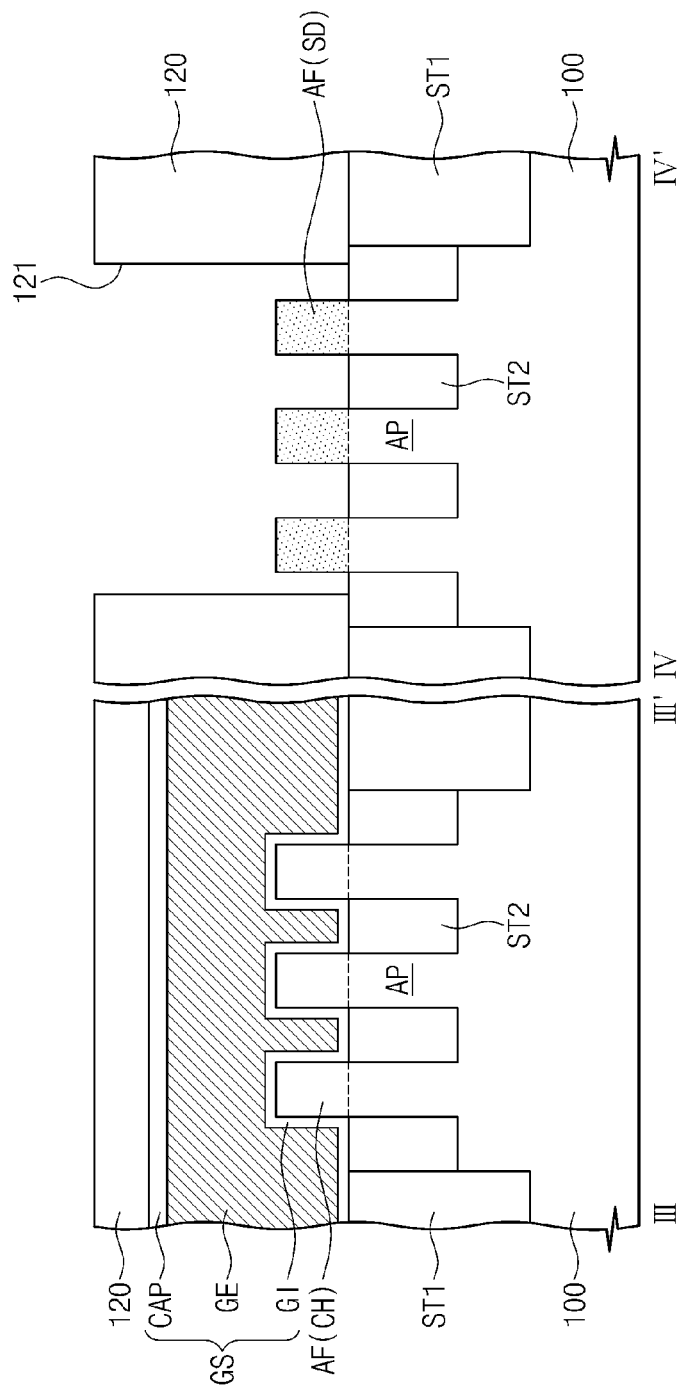

Referring to FIGS. 15A and 15B, the preliminary contact 113 may be selectively removed to form a contact hole 121 in the first interlayer insulating layer 120. The contact hole 121 may expose the active fins AF (e.g., the source/drain regions SD) and the second device isolation patterns ST2, which are disposed between the gate structures GS. If the preliminary contact 113 is formed of the poly-silicon, the preliminary contact 113 may be removed using, for example, phosphoric acid.

Figure 16A:
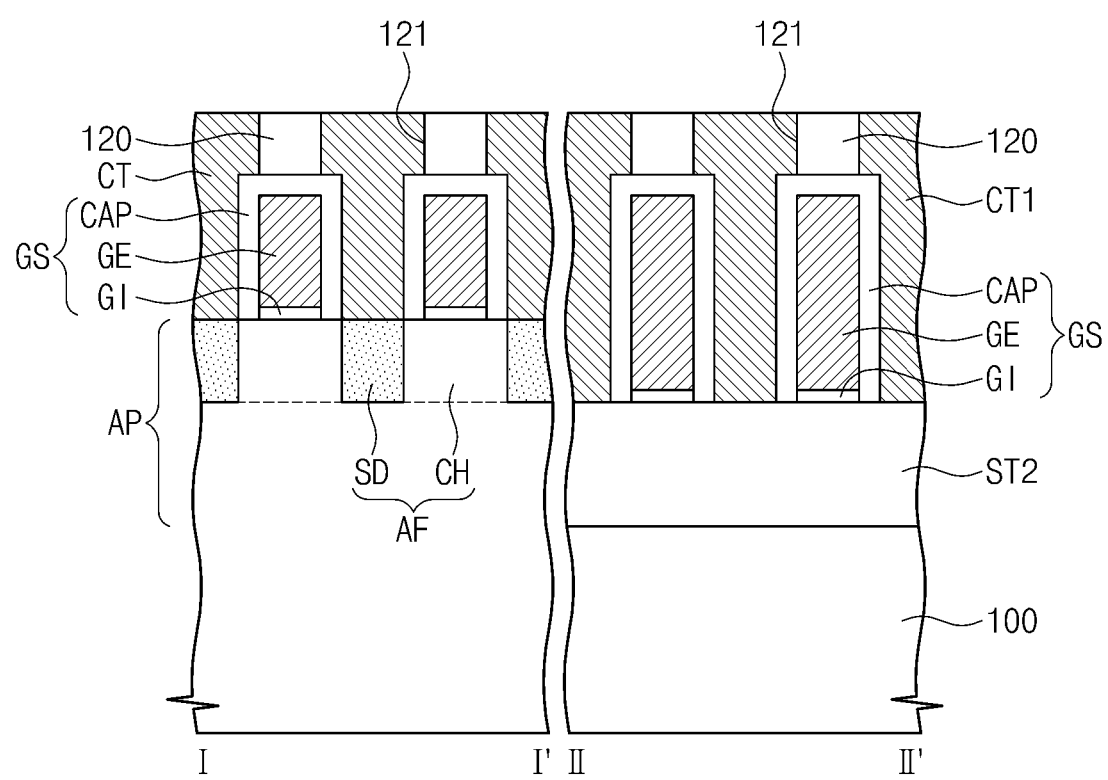
Figure 16B:
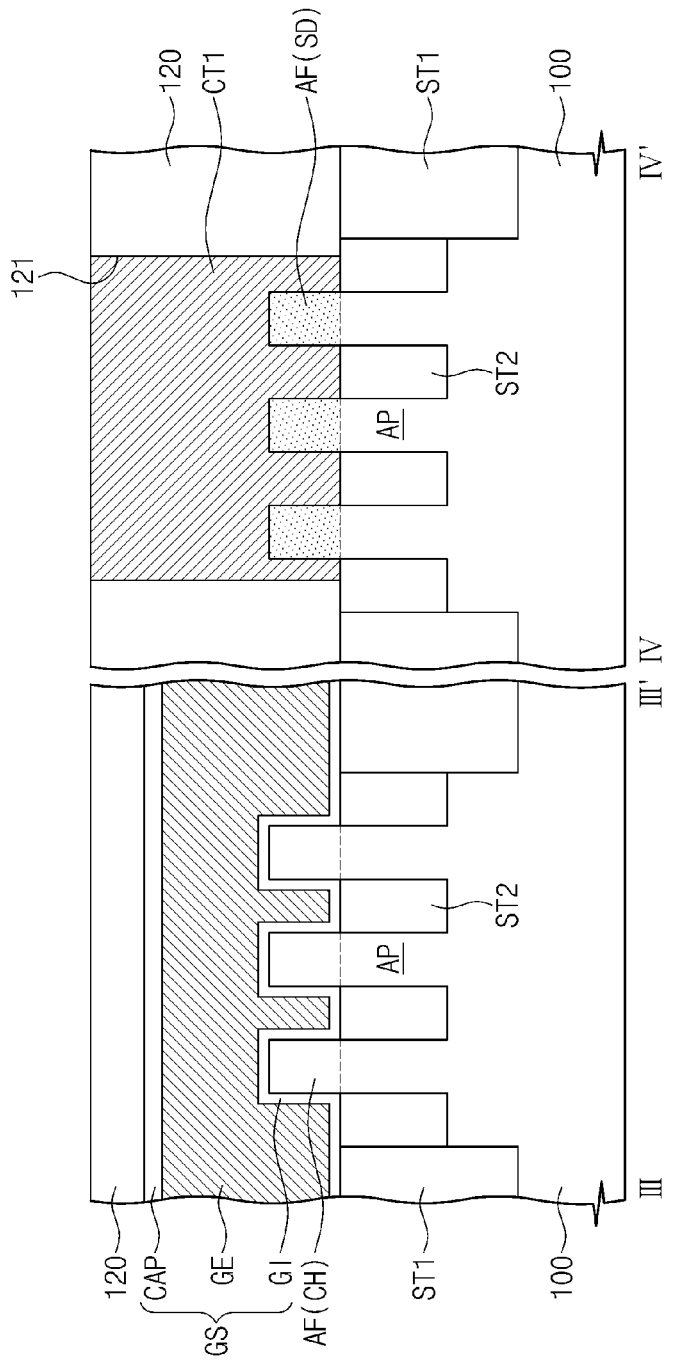

Referring to FIGS. 16A and 16B, a first contact CT1 may be formed in the contact hole 121. The first contact CTI may be in contact with the active fins AF (e.g., the source/drain regions SD). In addition, the first contact CT1 may also be in contact with the second device isolation patterns ST2 between the source/drain regions SD. The first contact CTI may include tungsten. In addition, the first contact CTI may further include a metal nitride layer (e.g., a titanium nitride layer, a tantalum nitride layer, or a titanium-aluminum nitride layer) disposed between the tungsten and an inner surface of the contact hole 121. A metal silicide layer (not shown) may be additionally formed between the first contact CT1 and the source/drain regions SD. The first contact CT1 may be electrically connected to the source/drain regions SD but may be insulated from the gate electrode GE by the capping pattern CAP.

Referring again to FIGS. 8A and 8B, a second interlayer insulating layer 130 may be formed on the first interlayer insulating layer 120. The second interlayer insulating layer 130 may include a silicon oxide layer. A contact pad 122 may be formed in the second interlayer insulating layer 130. The contact pad 122 may penetrate the second interlayer insulating layer 130 so as to be connected to at least one of the first contacts CT1. The contact pad 122 may include a metal and/or a conductive metal nitride, A third interlayer insulating layer 140 may be formed on the second interlayer insulating layer 130. The third interlayer insulating layer 140 may include a silicon oxide layer. A second contact CT2 may be formed in the third interlayer insulating layer 140. The second contact CT2 may penetrate the third interlayer insulating layer 140 so as to be connected to the contact pad 122. The second contact CT2 may include a metal and/or a conductive metal nitride, A common conductive line PW extending in the first direction D1 and connected to the second contact CT2 may be formed on the third interlayer insulating layer 140. The common conductive line PW may be shared by the PMOSFET region PR and the NMOSFET region NR adjacent to each other. Alternatively, the common conductive line PW may not be shared by the PMOSFET region PR and the PMOSFET region NR. The common conductive line PW may apply a drain voltage (e.g., a power voltage) or a ground voltage to the source/drain regions SD.

Figure 17:
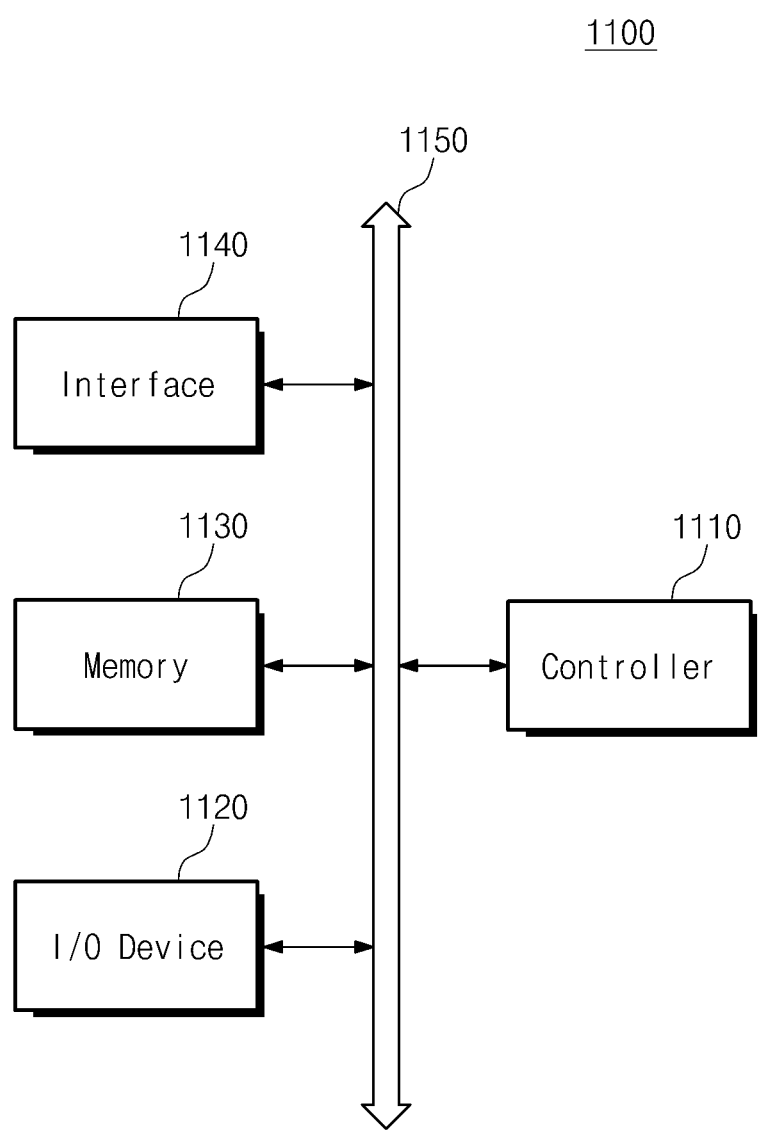
FIG. 17 is a schematic block diagram illustrating an embodiment of an electronic device including a semiconductor device according to some example embodiments of the inventive concepts.

FIG. 17 is a schematic block diagram illustrating an embodiment of an electronic device including a semiconductor device according to embodiments of the inventive concepts.

Referring to FIG. 17, the method of forming the semiconductor device according to embodiments of the inventive concepts may be used to realize an electronic device. An electronic device 1100 according to the embodiment may be one of a personal digital assistant (PDA), a laptop computer, a portable computer, a web tablet, a wireless phone, a mobile phone, a digital music player, a wireless or cable electronic device, or a complex electronic device including at least two thereof. The electronic device 1100 may include a controller 1110, an input/output (I/O) device 1120 (e.g., a keyboard, a keypad, and/or a display device), a memory device 1130, and an interface unit 1140 which are coupled to each other through a data bus 1150. For example, the controller 1110 may include at least one of a microprocessor, a digital signal processor, a microcontroller, or other logic devices having a similar function to any one thereof. The memory device 1130 may be used to store, for example, commands executed by the controller 1110. In addition, the memory device 1130 may also be used to store user's data. The electronic device 1100 may transmit data to a wireless communication network using a radio frequency (RF) signal or may receive data from the network by means of the interface unit 1140. For example, the interface unit 1140 may include an antenna or a wireless transceiver. The electronic device 1100 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LIE-Advanced, or MMDS.

Figure 18:
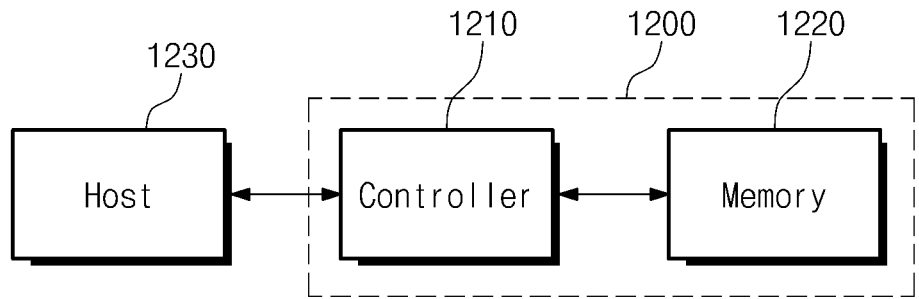
FIG. 18 is a schematic block diagram illustrating another embodiment of an electronic device including a semiconductor device according to some example embodiments of the inventive concepts.

FIG. 18 is a schematic block diagram illustrating another embodiment of an electronic device including a semiconductor device according to embodiments of the inventive concepts.

Referring to FIG. 18, the method of forming the semiconductor device according to embodiments of the inventive concepts may be used to realize an electronic device. An electronic device 1200 according to the embodiment may include a controller 1210. The controller 1210 may include an application processor (AP). The electronic device 1200 according to the present embodiment may further include a memory device 1220 used for storing massive data. In this case, the controller 1210 may control the memory device 1220 to read/write data from/into the memory device 1220 in response to read/write request of a host 1230. The controller 1210 may make an address mapping table for mapping an address provided from the host 1230 (e.g., a mobile device or a computer system) into a physical address of the memory device 1220.

According to embodiments of the inventive concepts, even though the distance between the gate structures and the thickness of the capping pattern covering the gate electrode are very small, it is possible to form the self-aligned contact without the not-open phenomenon. In addition, when the contact hole is formed, the occurrence of the polymer may be reduced as compared with a conventional art.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of forming a semiconductor device, the method comprising:

forming gate structures on a substrate; and
forming a contact between the gate structures,
wherein each of the gate structures comprises,
a gate insulating layer on the substrate;
a gate electrode on the gate insulating layer; and
a capping pattern covering a top surface and sidewalls of the gate electrode,
wherein forming the contact comprises,
forming a sacrificial layer covering the gate structures;
patterning the sacrificial layer to form a first opening in the sacrificial layer, the first opening exposing the substrate between the gate structures;
forming a preliminary contact in the first opening;
selectively removing the sacrificial layer;
forming an insulating layer that covers the gate structures and exposes the preliminary contact;
removing the preliminary contact to form a second opening in the insulating layer, the second opening exposing the substrate; and
forming the contact in the second opening,
wherein a ratio of an etch rate of the sacrificial layer to an etch rate of the capping pattern is greater than a ratio of an etch rate of the insulating layer to the etch rate of the capping pattern.

2. The method of claim 1, wherein the first opening is formed by a dry etching process using a gas containing oxygen, nitrogen, and hydrogen.

3. The method of claim 1, wherein the sacrificial layer includes a carbon-containing material or a photoresist.

4. The method of claim 3, wherein the sacrificial layer includes a spin-on-hardmask (SOH) layer or a SiCOH layer.

5. The method of claim 3, wherein the sacrificial layer is removed using an oxidation treatment, an ozone treatment, an ultraviolet (UV) treatment, or a wet cleaning process.

6. The method of claim 3, wherein the insulating layer includes a silicon oxide layer.

7. The method of claim 3, wherein the capping pattern includes at least one of a silicon nitride layer or a silicon oxynitride layer.

8. The method of claim 1, wherein the preliminary contact includes a material having an etch selectivity with respect to the sacrificial layer, the insulating layer, and the capping pattern.

9. The method of claim 8, wherein the preliminary contact includes poly-silicon or titanium nitride.

10. The method of claim 9, wherein the preliminary contact is deposited at a temperature of 400° C. or less.

11. The method of claim 1, wherein the capping pattern comprises:

sidewall capping patterns on the sidewalls of the gate electrode; and
an upper capping pattern on the top surface of the gate electrode.

12. The method of claim 11, wherein the gate insulating layer extends between the gate electrode and the sidewall capping pattern.

13. The method of claim 12, wherein the gate electrode comprises:

a metal layer including tungsten; and
a metal nitride layer between the metal layer and the gate insulating layer.

14. The method of claim 13, wherein the gate insulating layer includes a metal oxide layer.

15. A method of forming a semiconductor device, the method comprising:

forming an isolation pattern in a substrate to define active fins, the active fins protruding from the isolation pattern, the active fins extending in a first direction, and the active fins spaced apart from each other in a second direction intersecting the first direction;

forming gate structures intersecting the active fins and extending in the second direction, each of the gate structures comprising a gate insulating layer on the substrate; a gate electrode on the gate insulating layer; and a capping pattern covering a top surface and sidewalls of the gate electrode;

forming a preliminary contact in contact with the active fins and the isolation pattern between the gate structures;

forming an insulating layer that covers the gate structures and exposes the preliminary contact;

removing the preliminary contact to form a contact hole in the insulating layer, the contact hole exposing the active fins and the isolation pattern; and forming a contact in the contact hole, the contact connected to the active fins, and the contact being in contact with the isolation pattern.

16. The method of claim 15, wherein the forming a preliminary contact comprises:

forming a sacrificial layer covering the gate structures;

patterning the sacrificial layer to form a preliminary contact hole in the sacrificial layer, the preliminary contact hole exposing the active fins and the isolation pattern which are disposed between the gate structures; and forming the preliminary contact in the preliminary contact hole.

17. The method of claim 16, wherein the sacrificial layer includes a carbon-containing material or a photoresist.

18. The method of claim 16, wherein the capping pattern includes at least one of a silicon nitride layer or a silicon oxynitride layer.

19. The method of claim 16, wherein the preliminary contact includes poly-silicon or titanium nitride.

* * * * *